United States Patent [19]
Muraoka et al.

[11] Patent Number: 5,461,242
[45] Date of Patent: Oct. 24, 1995

[54] INSULATED GATE STATIC INDUCTION THYRISTOR WITH A SPLIT GATE TYPE SHORTED CATHODE STRUCTURE

[75] Inventors: Kimihiro Muraoka; Yoshinobu Ohtsubo, both of Kanagawa; Toshio Higuchi, Tokyo; Makoto Iguchi, Kanagawa; Takashige Tamamushi, Tokyo, all of Japan

[73] Assignee: Toyo Denki Seizo Kabushiki Kaisha, Tokyo, Japan

[21] Appl. No.: 145,436

[22] Filed: Oct. 29, 1993

[30] Foreign Application Priority Data

Nov. 6, 1992 [JP] Japan .................................. 4-322589

[51] Int. Cl.⁶ .......................... H01L 29/74; H01L 29/743
[52] U.S. Cl. .......................... 257/136; 257/152; 257/153; 257/144
[58] Field of Search .......................... 257/136, 138, 257/139, 147, 137, 152, 153, 150, 163, 169, 134, 135

[56] References Cited

FOREIGN PATENT DOCUMENTS

| | | |
|---|---|---|
| 1302727 | 5/1985 | Japan . |
| 0214470 | 9/1986 | Japan .................................. 257/136 |
| 1456781 | 1/1988 | Japan . |
| 1-37028 | 3/1989 | Japan . |
| 1-93169 | 4/1989 | Japan . |
| 1588399 | 4/1990 | Japan . |

*Primary Examiner*—Robert P. Limanek
*Assistant Examiner*—Wael M. Fahmy
*Attorney, Agent, or Firm*—McGlew and Tuttle

[57] ABSTRACT

In a gate insulated static induction thyristor with a split gate type shorted cathode structure, a first gate region of the split gate structure is used as a cathode short-circuit gate and the cathode region is formed between the first and second gate regions. A MOS structure is formed on the second gate region as a insulated gate control gate region electrode isolated therefrom. The MOS gate structure suppresses the minority carrier (hole) storage effect to permit high-speed switching of the thyristor, and the shorted cathode structure provides for increased maximum controllable current/voltage durability. The split gate structure can be used in combination with planar, buried, recessed and double gate structures.

14 Claims, 12 Drawing Sheets

→ HOLE CURRENT
---→ ELECTRON CURRENT

⟶ HOLE CURRENT
--- ⟶ ELECTRON CURRENT
—·— ⟶ HOLE BY-PASS CURRENT 5,461,242

INSULATED GATE STATIC INDUCTION THYRISTOR WITH A SPLIT GATE TYPE SHORTED CATHODE STRUCTURE

BACKGROUND OF THE INVENTION

1. Field of the Invention

The present invention relates to power semiconductor device and, more particularly, to a relatively simple-structured, insulated gate static induction thyristor with a split gate type shorted cathode structure wherein a first gate (a shielding gate) is shorted to a cathode region formed between it and a second gate and an insulated gate formed over the second gate is used as an insulated gate control gate electrode to enhance its isolation from a cathode short-circuit gate, thereby increasing the maximum controllable current/voltage durability of the device and permitting its highspeed switching.

2. Description of the Prior Art

It is well-known in the art that the above-mentioned maximum controllable current/voltage durability of a conventional thyristor, GTO, or similar device could be enhanced by the introduction thereinto of a shorted cathode structure. As for a static induction thyristor with a shorted cathode structure, there has been proposed a device structure for a planar gate type SI thyristor and it has been reported that speedup of device operation could be implemented without shortening the carrier lifetime in the device by the use of a double emitter-shorted structure combined with a shorted anode structure. FIG. 21 is a sectional view schematically showing the internal construction of an SI thyristor with a double emitter-shorted structure disclosed in "Switching Characteristics of an SI Thyristor with a Shorted Structure" EDD-90-59, SPC-90-58 presented in Joint Meeting on Electron Devices and Semiconductor Power Conversion, IEE of Japan (Oct. 26, 1990).

In FIG. 21 reference numeral 1 denotes a p+-type anode region, 2 an n+-type cathode region, 3 a p+-type gate region, 4 a cathode short-circuit region, 5 a high-resistivity region, 6 an n+-type static induction short-circuit region, 7 an anode electrode, 8 a cathode electrode, 9 a gate electrode, 10 a cathode short-circuit electrode, and 11 an oxide film.

In the conventional shorted cathode structure, as shown in FIG. 21, the cathode short-circuit region 4 is provided separately from the p+-type gate region 3 so that holes to be absorbed into the p+-type gate region 3 are partly absorbed by the cathode short-circuit region 4 to essentially reduce the hole density near the cathode side. Since the cathode short-circuit region 4 is spaced a predetermined distance apart from the p+ type gate region 3, however, the areas of the cathode region 2 and the p+-type gate region 3 are smaller than in a thyristor structure employing a common gate, and hence the area efficiency decreases accordingly. The decrease in the area of the cathode region 2 will cause a corresponding decrease in the current capacity of the thyristor as well. Hence, this prior art example is so low in area efficiency that it is not suited to providing a large current by a multi-channel structure of the device.

In Japanese Patents NO. 1588399 entitled "Static Induction Thyristor" and No. 1456781 entitled "Double Gate Type Static Induction Thyristor" there are disclosed split gate type SI thyristors of the type wherein a gate region surrounding a channel is split into a plurality of gates and one of them is used as a driving gate to sufficiently reduce the electrostatic capacitance viewed from the gate, permitting high-speed switching of large current. Yet, these patents disclose only enhancement of the function of a control gate by dividing the gate but does not ever disclose the shorted cathode structure which positively enhances the function of a non-control gate to improve the maximum controllable current/voltage durability.

A split gate type static induction transistor is also disclosed in Japanese Patent No. 1302727 entitled "Static Induction Transistor and Semiconductor Integrated Circuit," for instance; but the invention disclosed in the patent is directed to transistors and is applied to integrated circuits that operate at low voltages. Although the invention permits improvement of the function of the control gate, nothing is disclosed about measures for improving the function of the non-control gate. Moreover, the patent does not ever disclose anything about a shorted source structure that corresponds to the shorted cathode structure according to the present invention. The reason for this is that the non-control gate is not so important because of the split gate structure of the transistor.

On the other hand, a semiconductor imaging device that utilizes the split gate type transistor as one pixel (a picture element) has also been proposed and is disclosed in Japanese Pat. Publication Gazette No. 37028/89. In this imaging device, the gate is split into a control gate and a shielding gate; the shielding gate is used as a region for device isolation and shields against irradiation by light, and the control gate is used as an ordinary gate and is covered with a capacitor that is used to store optical information.

In the above-mentioned Publication Gazette there are proposed, with a view to separating the functions of the two gate regions, a structure in which the distance between the shielding gate region and the source (drain) region formed as a main electrode in the wafer surface is short and a structure in which the shielding gate region is formed deep.

However, such structures for isolating the functions of split gates have not been proposed for semiconductor devices that operate under, and withstand high voltage, large current and high intensity electric field conditions, such as thyristors. In the case of the above-mentioned imaging device or split gate type static induction transistor, the voltage that is applied to the main electrode is as low as 5 volts or so and conducting carriers are electrons (in the case of an n-channel device). The effect of storage of holes that are carriers injected from a pn junction control gate is less than in the case of using a common gate. In the split gate type static induction thyristor, however, conducting carriers are both electrons and holes and it is holes injected from the anode region into the cathode region as well as holes injected from the control gate that have an influence on the minority carrier storage effect in the vicinity of the cathode side, in particular. In conventional split gate type static induction thyristors there have not been taken any measures for solving a problem such as how to control the hole current from the anode region by the shielding gate to increase the maximum controllable current/voltage durability.

The use of the split gate structure reduces the quantity of holes that are injected from the control gate, but the holes that are flowing into the cathode region are mostly those from the anode region.

In connection with split gate type static induction thyristors, it is well-known that splitting of the gate reduces the input capacitance and increases the mutual conductance Gm at the time of electron injection from the cathode region, a decrease in the RC time constant by the reduced input capacitance providing high-speed turn-OFF performance;

but no structure has been proposed which improves the turn-OFF performance by separating the functions of the split gates to provide for increased maximum controllable current/voltage durability. Nor has there been proposed any structure wherein the holes injected from the anode side are positively flowed into the shielding gate region to lighten the burden on the control gate and prevent the turn-OFF characteristic from being suppressed by the minority carrier storage effect near the cathode side.

To solve the above-mentioned defects of the prior art, the inventors of this application have previously proposed, in Japanese Pat. Appln. No. 289244/92, a static induction thyristor with a shorted cathode structure wherein first and second gates are both formed as pn junction gates. The static induction thyristor disclosed in the above-said prior application is a static induction thyristor with a split gate type shorted cathode structure which lessens the minority carrier (hole) storage effect near the cathode side to attain high-speed turn-OFF performance, increase the maximum controllable current/voltage durability and permit high-speed switching.

More specifically, the channel is surrounded by two split gates, one used as a control gate and the other as a cathode short-circuit gate electrically shorted to the cathode. As compared with conventional structures, this structure provides a high channel integration density and consequently a high area efficiency, lessens the minority carrier storage effect to increase the switching speed, and increases the maximum controllable current/voltage durability by the cathode shortcircuit effect.

The static induction thyristor with a split gate type shorted cathode structure, disclosed in the above-mentioned prior application, has an anode region, a cathode region and a control region formed in a high-resistivity region. The control region includes first and second gate regions separated from each other. A shield gate electrode formed in contact with the first gate region and a cathode electrode formed in contact with the cathode region are electrically shorted to form a shorted cathode structure. A current flow between the cathode region and the anode region is controlled by a voltage that is applied to a control gate electrode formed in contact with the second gate region. In the high-resistivity layer adjoining the cathode region there are formed a first depletion layer by the built-in potential between the first gate region and the high-resistivity layer and a second depletion layer by the built-in potential between the second gate region and the high resistivity layer. At the same time, a potential barrier, which is controllable with a static induction effect by the voltage of the control gate electrode that is applied to the second gate region, is formed in the high-resistivity layer near the boundary between the first and second depletion layers. Holes injected from the anode region partly flow through the first gate region and into the cathode electrode shorted to the shield gate electrode.

The first gate region has an impurity concentration higher than that of the second gate region.

The distance between the first gate region and the cathode region is selected to be shorter than the distance between the second gate region and the cathode region; namely, the cathode region is formed closer to the first gate region than to the second gate region.

The first gate region includes a medium or low impurity concentration diffused region of the same conductivity type as that of the first gate region, formed deeper than the second gate region, and a high impurity concentration diffused region formed in the medium or low impurity concentration regions.

The first gate region is formed deeper and wider than the second gate region.

The cathode region is separated from the first and second gate regions by a medium or low impurity concentration region of the same conductivity type as that of the cathode region and formed around the cathode region.

One or both of the first and second gates have a buried gate structure.

Alternatively, the first and second gate regions both have the buried gate structure, and the first and second gate region are adjacent each other.

Alternatively, one or both of the first and second gate regions have a recessed gate structure.

Alternatively, the cathode region, the anode region and the first and second gate regions are all formed in the vicinity of the same main surface of the wafer.

FIG. 22 is a schematic cross-sectional view for explaining the principle of operation of the static induction thyristor disclosed in the aforementioned Japanese Pat. App. No. 289244/92. FIG. 23 is a schematic equivalent circuit representation of the static induction thyristor shown in FIG. 22. As will be seen from FIG. 23, the operation of the static induction thyristor of FIG. 22 can be regarded as parallel operations of two thyristors since it has the split gate structure. In FIG. 22, reference numeral 1 denotes an anode region, 2 a cathode region, 31 a first gate region that is called a cathode short-circuit gate or shielding gate, 32 a second gate region that is called a control gate, 5 a high resistivity layer, 7 an anode electrode, 8 a cathode electrode, 9 a gate electrode, 10 a cathode short-circuit electrode, and 11 an oxide (SiO2) film. The gate electrode 9 is a control gate electrode, and the cathode short-circuit electrode 10 is the electrode of the cathode short-circuit gate (or shielding gate) and is essentially shorted to the cathode electrode 8.

Of course, it does not matter, theoretically, whether the gate regions 31 and 32 are pn junction gates, MIS (MOS) gates, Schottky gates, or hereto junction gates. They need only to have a gate structure that permits control of current between the cathode 2 and the anode 1 by the static induction effect. In FIG. 22, reference character $W_1$, indicates the width of a depletion layer spreading around the first gate 31 and $W_2$ the width of a depletion layer around the second gate *$32$. Reference character G * indicates what is called an intrinsic gate point, which corresponds to the top of a static induction barrier height. The potential barrier near the point *G acts as a barrier against holes present in the first and second gates as well as electrons in the cathode. For instance, when the thyristor is in the OFF state, a potential barrier of a sufficient height is formed near the point G * against the electrons in the cathode, while at the same time it also serves as a potential barrier against the holes in the first gate 31 and the second gate 32. Consequently, when the thyristor is in the OFF state, no electron current conducts between the anode and the cathode, and no hole current conducts between the first and second gates 31 and 32 either.

As the potential barrier height near the point G* is decreased by the application of a positive voltage to the control gate electrode 9 of the second gate 32, an electron injection from the cathode 2 begins. Holes are also injected from the second gate 32, but the quantity of holes injected is far smaller than the quantity of holes that are injected from the anode 1 afterward. Besides, the quantity of holes that are injected from each split gate is also smaller than in the case of employing a common gate, which is an advantage of the split gate structure, the carrier storage effect of the gate is small. Furthermore, since the potential barrier against the holes is present near the point G*, the hole current from the second gate 32 to the first gate 31 is mainly a displacement current accompanying capacitive coupling, and an essential conducting current is very small. As the electrons injected from the cathode 2 are stored near the interface between the anode region 1 and the high-resistivity layer 5 and the height of the potential barrier against the holes in the anode region I decreases accordingly, injection of holes from the anode region I starts. The hole current from the anode region 1 mostly flows into the first gate 31 electrically shorted to the cathode region 2, the remaining hole current flowing into the second gate 32. The rate at which the hole current flows into the first and second gates 31 and 32 is dependent of the configuration of the potential distribution by the relative potential difference between the first and second gates 31 and 32, their area ratio or their shapes such as geometrical depths. When the second gate 32 is held at a positive potential relative to the first gate 31, it is expected that the quantity of holes flowing into the first gate 31 will be essentially larger than to the second gate 32. The reason for this is that the first gate 31 is lower in potential than the second gate 32 and hence is essentially in a state in which it readily stores the holes. However, the second gate 32 that serves as a control gate is small in electrostatic capacitance, and hence is readily charged by a relatively small hole current. This is another advantage of the split gate structure. In consequence, the potential at the point G* further decreases, causing further injection of electrons and further supply of holes from the anode electrode 7 and the anode region 1. By this, the thyristor is put into a latch-up state, in which the potential at the point G* decreases, permitting the formation of a channel for electrons between the anode region I and the cathode region 2. On the other hand, the potential barrier against holes increases, resulting in a high potential barrier being formed between the first and second gate regions 31 and 32.

That is, substantially no hole current flows between the first and second gate regions 31 and 32. Hence, when the thyristor is in the ON state, electrons from the cathode region 2 flow into the anode region 1 and thence to anode electrode 7, whereas holes from the anode region 2 flow into the first gate 31 and the cathode region 2, respectively.

Next, a description will be given of the turn-OFF operation of the thyristor. When a negative voltage is applied to the gate electrode 9, the width $W_2$ of the depletion layer spreading out from the second gate 32 into the high-resistivity layer 5 increases, the potential barrier height near the point G* increasing. As a result, the hole current that has flowed into the cathode region 2 and the first gate region 31 from the anode region 1 so far partly flows into the negatively biased second gate region 32 and thence to the control gate electrode 9. Yet, the quantity of the hole current that flows into the second gate region 32, by-passing the first gate region 31, is far smaller than the total amount of hole current flowing into the first gate (the short-circuit gate) region 31, rather, the injection of electrons from the cathode region 2 stops, since the potential barrier height near the point G* is instantaneously increased by the negative bias voltage applied to the second gate region 32. In this state the hole current from the anode region 31 mostly flows into the first gate (or short-circuit gate) region 1 but the quantity of this current gradually decreases. The hole current having flowed into the cathode region 2 so far flows into the negatively biased second gate (or control gate) region 32. Thus, the entire hole current is shared between the first and second gate regions 31 and 32 because of the split gate structure, and hence the amount of hole current that the control gate (or second gate) region 32 needs to control may be far smaller than in the case where a common gate structure is used. Moreover, the use of the split gate structure reduces the quantity of holes that are injected from the respective gate, and hence the minority carrier (holes) storage effect is lessened accordingly.

To stop the hole injection from the anode region 1 after the electron injection frown the cathode region 2 has also been stopped by the restoration of the potential barrier at the point G* to its original height by negative biasing of the second gate region 32, it is necessary to extinguish the electrons stored near the anode region I through structural or lifetime control and through use of a structure which stops the hole injection from the anode region I (an SI anode short, double gate structure, for instance) or by effecting hole lifetime control.

Since the first gate region 31 is always electrically shorted to the cathode region 2, holes near the first gate region 31 are readily absorbed thereinto. Hence, the hole storage effect near the cathode region 2 and near the first gate region 31 is insignificant. Moreover, since there is no potential difference between the first gate region 31 and the cathode region 2, the width of the depletion layer spreading from the first gate region 31 to the cathode region 2, is substantially constant, the capacitance between the first gate region 31 and the cathode region 2, undergoing little change. Hence, the capacitance between the second gate region 32 and the cathode region 2 more greatly contributes to the switching operation of the thyristor. On the other hand, the width $W_1$ of the depletion layer spreading from the first gate region 31 toward the anode region 1 undergoes a substantial change with the voltage condition in the anode region 1, and this causes a substantial change in the capacitance between the first gate region 31 and the anode region 1; it is preferable that the influence of such a large capacitance change be prevented from affecting the cathode side.

In the static induction thyristor with a shorted cathode structure, disclosed in the aforementioned prior Japanese patent application, the anode-to-cathode current that is controlled by the control gate (or second gate region) 32 can essentially be increased by the effect of the first gate (or short-circuit gate) region 31 which serves as a hole absorbing region, and hence the maximum controllable current durability can be expected to increase. Furthermore, the amount of holes injected from the control gate 32 is small and the number of carriers (holes) stored near the cathode region 2 during the ON state of the thyristor is also made virtually smaller by the shorted gate structure than in the case where the common gate structure is utilized. Hence, the amount of holes to be absorbed by the control gate 32 during the turn-OFF of the thyristor may be so small that the turn-OFF switching performance could be improved. Besides, it is also expected as another advantage of the split gate structure that the turn-ON switching performance is improved by the reduction of the gate input capacitance.

With the above-described split-gate, shorted-cathode structure, it is possible to implement a static induction thyristor which is high in the area efficiency because of the high channel integration density, high in the switching speed because of the lessened minority carrier storage effect and high in the maximum controllable current/voltage durability because of the use of the shorted cathode structure. The split gate structure can be formed as a planar, buried, recessed or double gate structure, and it is applicable to medium, small and large power semiconductor devices and high voltage integrated circuits as well.

In the case of using the structure wherein the first and second gate regions 31 and 32 are both formed by pn junction gates, however, it is necessary, for separating their functions, that they be formed with different impurity densities or in different sizes, for instance. On the other hand, the first gate region 31, which is formed as a pn junction gate for absorbing holes injected from the anode region 1, is indispensable to the thyristor, but the second gate region 32 as the control gate need not always be a pn junction gate, because the function of the second gate 32 as the control gate is to control the electron injection from the cathode region 2 through use of a potential barrier. Where the control gate is formed by a pn junction gate, the hole injection frown the control gate incurs the storage of extra minority carriers. In addition, it is difficult to completely isolate the pn junction of the control gate from the pn junction forming the first gate region 31. In other words, the potential of the second gate region 32 is affected by the potential of the first gate region 31, and hence it is hard to attain independent controllability of the control gate 32.

In view of the above, the inventors of this application proposes a novel structure that has the cathode region 2 formed virtually between the first and second gate regions 31 and 32 and controls the injection of electrons from the cathode region 2 by an insulated gate control gate electrode. That is, an insulated gate control gate electrode formed over the second gate region 32 with an insulating film interposed therebetween is used as the control gate. With this structure, since a MOS insulating layer is interposed between the second gate region 32 and the insulated gate, control gate electrode, the injection of minority carriers from the control gate electrode is essentially suppressed. A channel region for electrons, is that region of the high-resistivity layer surrounded by the first and second gate regions 31 and 32, and since a MOS gate electrode acts as insulated gate control gate electrode, the channel is formed in the high-resistivity layer by capacitive coupling drive of the second gate region 32 by a voltage pulse applied to the insulated gate, control gate electrode; hence the controllability of the channel is very excellent. In addition to this, the structure is very simple. The high-resistivity region 5 between the first and second gate regions 31 and 32 is virtually depleted, and in this region 5 there is formed, a potential barrier which is, controllable by the voltage applied to the insulated gate control gate electrode through the static induction effect. In this instance, the potential of the second gate region 32 will be controlled static-inductively by capacitive coupling on the basis of the potential of the first gate region 31. Since the insulating layer is formed all over the second gate region 32, however, only a pulsed displacement current flows between the insulated gate control gate electrode and the first gate region 31 due to their capacitive coupling and substantially no conducting current flows therebetween; hence, they are isolated substantially.

SUMMARY OF THE INVENTION

It is therefore an object of the present invention to provide an insulated gate static induction thyristor with a split gate type shorted cathode structure which lessens the minority carrier (hole) storage effect to provide a high-speed turn-OFF capability, enhanced maximum controllable current/ voltage durability and a high-speed switching capability and which is simple-structured and highly excellent in the isolation between the cathode short-circuit gate and the insulated gate control gate electrode.

Another object of the present invention is to provide a simple-structured, insulated gate static induction thyristor with a split gate type shorted-cathode structure in which a channel is surrounded by two regions, a first one of them is used as a cathode short-circuit gate electrically shorted to a cathode region formed between the first and second gate regions and an insulated gate control gate electrode is formed all over the second gate region with an insulating layer interposed therebetween to enable control of the injection of electrons from the cathode region, thereby enhancing the isolation between the first gate region and the insulated gate control gate electrode, increasing the channel integration density and hence improving the area efficiency, lessening the minority carrier storage effect to increase the switching speed and increasing the maximum controllable current/voltage durability by the shorted cathode structure.

The split gates mentioned in this specification are gate regions into which the common gate region surrounding the channel region, in the prior art are split. Since the gate region includes a pn junction gate region and a MIS gate region and a Schottky gate region as well, the split gates mentioned herein also include split versions of such gates. The split gates may be a combination of different gates, such as a pn junction gate and a MIS gate or Schottky gate. In such a case, the different gates are separated functionally as well as physically. In a primary embodiment of the present invention which uses the MIS gate as the control gate and the pn junction gate as the shield (short-circuit) gate, the isolation between the short-circuit gate and the control electrode is particularly enhanced. It is also possible to split the control gate at the anode side as well as at the cathode side and to form a shorted anode structure for one of the split gates. In this case, there will be provided a double gate static induction thyristor with a split-gate, shorted-anode structure. In such a double gate static induction thyristor it is impossible to form the first gate as a split-gate, shorted-cathode structure and the second gate as a split-gate, shorted-anode structure.

In one aspect, the present invention relates to an insulated gate static induction thyristor with a split gate type shorted cathode structure which has an anode region, a cathode region and a control region formed in a high-resistivity region and in which: the control region includes first and second split gate regions; the cathode region is formed virtually in the high-resistivity layer, between the first and second gate regions; a channel region is formed in the high-resistivity layer which is surrounded by the first and second gate regions; a shield gate electrode formed in contact with the first gate region and a cathode electrode formed in contact with the cathode region are electrically shorted to form a shorted cathode structure; an insulated gate control gate electrode is formed all over the second gate region with an insulating layer interposed therebetween and a current flow through the channel region, between the cathode region and the anode region is controlled by a voltage that is applied to the insulated gate, control gate electrode; a first depletion layer by the built-in potential between the first gate region shorted to the cathode region and the high-resistivity layer and a second depletion layer by the built-in potential between the second gate region and the high-resistivity layer are formed in the high-resistivity layer near the and the both depletion layers essentially contact each other, enabling the potential of the second gate region to be controlled by the potential of the first gate region in terms of capacitive coupling; a potential barrier which is controllable by the static induction effect is formed in the channel region and the height of the potential barrier is static inductively controlled by the voltage which is applied to the insulated gate control gate electrode; holes injected from the anode region mainly flow through the first gate region and partly flow through a channel region into the cathode electrode shorted to the shield gate electrode; and electrons injected from the cathode region mainly flow through the channel region.

In a further aspect of the present invention, an auxiliary cathode region of the same conductivity type as that of the cathode region is formed in the second gate region; an insulated gate transistor is essentially formed between the auxiliary cathode region and the cathode region by the second gate region and the insulated gate, control gate electrode formed above the second gate region but isolated therefore by the insulation layer interposed therebetween; electrons injected from the cathode region are stored in the auxiliary cathode region; and a potential barrier that is controlled by the static induction effect is formed in the high-resistivity layer adjoining the cathode region by the first and second depletion layers spreading from the first and second gate regions.

In a further aspect of the present invention, the insulated gate control gate electrode is extended over the high-resistivity layer surrounded by the first and second gate regions and over on the first gate, with an insulating layer interposed therebetween and an insulated gate transistor is essentially formed between the first and second gate regions.

In a further aspect of the present invention, the second gate region is also electrically shorted to the cathode region via the cathode electrode.

In a further aspect of the present invention, the first gate region is formed larger than the second gate region including the cathode region.

In a further aspect of the present invention, the first gate region has an impurity concentration higher than that of the second gate region.

In a further aspect of the present invention, the first gate region includes a medium or low impurity concentration region of the same conductivity type as that of the first gate region and formed deeper than the second gate region and a high impurity concentration region formed in the medium or low impurity concentration region.

In a further aspect of the present invention, the first gate region is formed deeper and wider than the second gate region.

In a further aspect of the present invention, the first and second gate regions are each formed as a planar gate structure.

In a further aspect of the present invention, the first gate region has a buried gate structure.

In a further aspect of the present invention, the insulated gate control gate electrode has a recessed gate structure.

In a still further aspect of the present invention, the cathode region, the anode region and the first and second gate regions are all formed near the same main wafer surface as a lateral structure.

In a still further aspect of the present invention, the high-resistivity layer is formed in a dielectric substrate.

DESCRIPTION OF THE PREFERRED EMBODIMENTS

Figure 1:
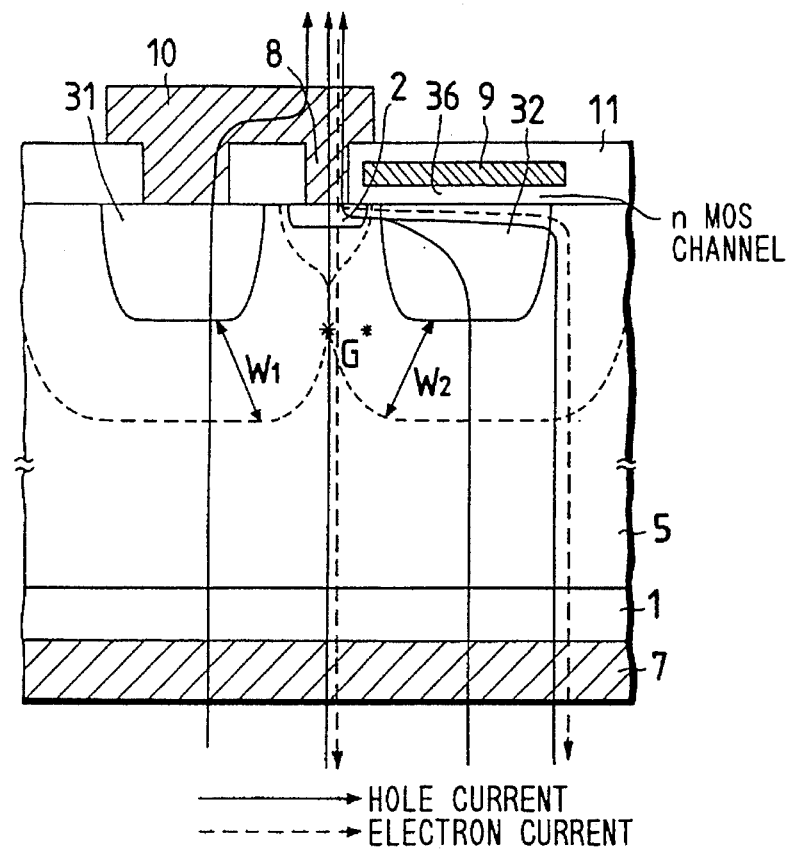
FIG. 1 is a sectional view schematically illustrating a first embodiment of the present invention.

FIG. 1 schematically illustrates, in section, a first embodiment of the insulated gate static induction thyristor with a split gate type shorted cathode structure according to the present invention, for explaining its principle of operation. In FIG. 1, reference numeral 1 denotes an anode region, 2 a cathode region, 31 a first gate region that is called a cathode short-circuit gate or shielding gate, 32 a second gate region separated by the cathode region 2 from the first gate region 31, 9 a region called an insulated gate control gate electrode formed on the second gate region 32 with a gate oxide film 36 interposed therebetween, 5 a high-resistivity layer, 7 an anode electrode, 8 a cathode electrode, 10 a cathode short-circuit electrode, and 11 an oxide (SiO2) film. The cathode short-circuit electrode 10 is an electrode of the cathode short-circuit gate electrode (or shielding gate) 31, and in practice, it is shorted to the cathode electrode 8.

Theoretically, the gate regions 31 and 32 may be pn junction gates, MIS (MOS) gates, Schottky gates, or hetero junction gates. The point is that these gate regions need only to be able to control a current flow between the cathode region 2 and the anode region 1 by the static induction effect. The present invention employs therefor an insulated gate structure that has an insulated gate control gate electrode formed all over the second gate region 32 with an insulating layer interposed therebetween, instead of using the second gate electrode itself as the control gate. In FIG. 1, reference character $W_1$ indicates the width of the depletion layer spreading around the first gate region 31 and $W_2$ the width of the depletion layer spreading around the second gate region 32. G * is a point commonly referred to as an intrinsic gate point and corresponds to the point where the height of a static induction barrier for electrons becomes minimum. The potential barrier near the point G * acts as a barrier not only against electrons in the cathode region 2 but also against holes in the first and second gate regions 31 and 32. For example, when the thyristor is in the OFF state, a potential barrier of a sufficient height is formed near the point G * against the electrons in the cathode region 2, and it also serves as a potential barrier against the holes in the first and second gate regions 31 and 32. Hence, when the thyristor is in the OFF state, no electron current flows between the anode and the cathode nor does a hole current flow between the first and second gate 31 and 32.

By applying a positive voltage to the insulated gate control gate electrode 9 formed above the second gate region 32, the height of the potential barrier at the point G* is reduced, starting the injection of electrons from the cathode region 2. Holes are also injected from the second gate region 32 as a displacement current from the insulated gate control gate electrode 9, but the amount of holes injected is far smaller than the amount of holes that are injected from the anode region I afterward. In addition, the quantity of holes injected from the second gate region 32 is so smaller than in the case of using a common pn junction gate that the minority carrier storage effect by the gate is slight—this is implemented by the use of the split gate structure and the insulated gate. Because of the potential barrier against holes in the vicinity of the point G*, the hole current from the second gate region 32 to the first gate region 31 in mostly a displacement current by capacitive coupling and an essential conducting current is very small. By the positive voltage applied to the insulated gate control gate electrode 9, the potential of the second gate region 32 also goes positive in a capacitive-coupling manner, with the result that the width $W_2$ of the depletion layer also decreases. At the same time as the injection of electrons from the cathode region 2 starts, a conduction channel for electrons is formed in the high-resistivity layer 5 surrounded by the first and second gate regions 31 and 32. Consequently, electrons in the cathode region 2 are injected into the high-resistivity layer 5 and thence to the anode side. As the electrons injected from the cathode region 2 are stored near the interface between the anode region I and the high-resistivity layer 5 and the barrier height against holes in the anode region I decreases accordingly, the injection of holes from the anode region 1 begins. The hole current from the anode region I mostly flows into the first gate region 31 electrically shorted to the cathode region 2, the remainder flowing into the cathode region 2 through the channel region and the second gate region 32. The rates at which the hole current flows into the first and second gate regions 31 and 32 are dependent upon the shape of the potential distribution based on the potential difference between the both gate regions, their area ratio, or their geometrical depths or similar configurational factors. When the second gate region 32 is held positive relative to the first gate region 31, it is anticipated that more holes will flow into the first gate region 31 than those flowing into the second gate region 32. The reason for this is that the first gate region 31 is lower in its potential barrier against holes than the second gate region 32 and is in a state in which it readily stores the holes. On the other hand, the second gate region 32 covered with the insulated gate control gate electrode 9 formed thereabove is readily charged by a relatively small hole current flowing thereinto since its substantial electrostatic capacitance is substantially small. In consequence, the potential at the point G * further drops, causing further injection of electrons, while at the same time further supplying holes from the anode electrode 7 via the anode region 1. As the result of this, the thyristor enters its latch-up state. In the latch-up state the potential at the point G* is low, allowing the formation of a channel for electrons between the anode region I and the cathode region 2. On the other hand, the potential barrier against holes increases, resulting in a high potential barrier being formed between the first and second gate regions 31 and 32.

That is, substantially no hole current flows between the first and second gate regions 31 and 32. Thus, when the thyristor is in the ON state, electrons from the cathode region 2 flow into the anode region I and then to the anode electrode 7, whereas holes from the anode side flow mainly into the first gate region 31 (i.e. the gate shorted to the cathode) and into the cathode region 2 through the channel region and the second gate region 32. In FIG. 1 there are schematically indicated by arrows how the electron current and the hole current flow when the thyristor is in the ON state. Incidentally, the insulated gate static induction thyristor with a split gate type shorted cathode structure according to the present invention has two modes for its ON state: the above-said latch-up mode and a non-latch-up mode. In the latch-up mode, the main thyristor is held ON even if the positive voltage applied to the insulated gate control gate electrode 9 at the time of its turn-ON operation is cut off and returns to a zero-bias state. This is what is called a thyristor mode. In the non-latch-up mode, the main thyristor is not held ON when the above-mentioned positive voltage is cut off and returns to the zero-bias state. This is what is called a transistor mode. Hence, in the non-latch-up mode, it is necessary to continue application of the positive voltage to the insulated gate control gate electrode 9 to maintain the main thyristor in the ON state. In the case of a structure wherein the second gate region 32 is kept floating and is not electrically shorted to the cathode region 2 or auxiliary cathode region 21 (FIGS. 1, 3, 5, 7, 11, 13, 14, 15, 16, 17, 18, 19 and 20, for instance), the main thyristor mostly operates in the latch-up mode. In the case of a structure wherein the second gate region 32 is electrically shorted to the cathode region 2 or auxiliary cathode region 21 (FIGS. 6 and 9, for instance), the main thyristor mostly operates in the non-latch-up mode. It is a matter of course that the application of the positive voltage to the insulated gate control gate electrode 9 may be continued so as to ensure that the turn-ON state of the main thyristor is held in the latch-up mode as well.

Next, a description will be given of the turn-OFF operation of the thyristor. Applying a negative voltage to the insulated gate control gate electrode 9 above the second gate electrode 32, the width $W_2$ of the depletion layer spreading into the high-resistivity layer 5 from the second gate region 32 increases and the height of the potential barrier at the point G* increases, cutting off the channel between the cathode region 2 and the anode region 1. As a result, the hole current that has flowed into the cathode region 2 and the first gate region 31 from the anode region I so far partly flows into the second gate region 32 being negatively biased. In this instance, however, the quantity of hole current that flows into the second gate region 32, by-passing the first gate region 1, is far smaller than the total quantity of hole current flowing into the first gate (i.e. short-circuit gate) region 31. Upon application of the negative bias voltage to the insulated gate control gate electrode 9, the potential barrier height near the point G * increases instantaneously, stopping the injection of electrons from the cathode region 2. In this state, the hole current from the anode side mostly flows into the first gate region 31 but the quantity of this hole current gradually decreases. The hole current flowing into the cathode region 2 also gradually decreases by the effect of the potential of the insulated gate control gate electrode 9 formed above the second gate region 32. Thus, the hole current that the insulated gate control gate electrode 9 has to control may be far smaller than in the case of employing the common gate, since the entire hole current is shared between the first and second gate regions 31 and 32 through utilization of the split gate structure. Moreover, since the split gate structure is employed which includes the insulated gate structure, the quantity of holes that are injected from the gate is so small that the minority carrier (hole) storage effect can also be substantially lessened.

Next, a description will be given to the operation of the insulated gate static induction thyristor with a split gate type shorted cathode structure according to the present invention. The first and second gate regions 31 and 32 are separated by the high-resistivity layer 5, but since the depletion layers spreading from the first and second gate regions 31 and 32 overlap each other, the potential of the second gate region 32 is controllable by the potential of the first gate region 31 in terms of static induction. The second gate region 32 may be electrically shorted to the cathode region 2 or held electrically floating. When it is held floating, holes injected from the anode side are partly stored in the second gate region 32, effectively promoting the injection of electrons from the cathode region 2. When the cathode region 2 and the second gate region 32 are electrically shorted, the holes stored in the second gate region 32 are absorbed by the cathode short-circuit electrode 10. Thus, the injection of electrons from the cathode region 2 is controlled mainly by MOS capacitor drive by the insulated gate control gate electrode 9 or equivalent n-MOSFET drive, and hence the hole storage effect by the second gate region 32 is practically negligible.

The turn-ON operation of the insulated gate static induction thyristor according to the present invention will be supplemented below. The turn-ON operation that can be applied not only in the case where the auxiliary cathode region 21 (FIG. 3) is taken into account in the basic structure of FIG. 1 but also in the case where it is not taken into account is to drive the second gate region 32 positive in a pulsed fashion by the positive voltage that is applied to the insulated gate control gate electrode 9. In the drive mode by such a MOS capacitor, the second gate region 32 is driven positive in a pulsed fashion, biasing the p(32)n− (5) junction in the forward direction. Even if the first and second gate regions 31 and 32 are preset to be normally OFF therebetween, a channel is formed between the cathode and the anode by the positive bias driving of the second gate region 32. As the result of this, electrons that flow from the cathode region 2 into the high-resistivity layer 5 through the MOS gate interface or deep channel readily go beyond the lowered potential barrier and reach the anode side. To ensure the execution of such turn-ON drive mode by the MOS capacitor coupling, it is important to set the MOS capacitance large. That is, the MOS capacitance between the insulated gate control gate electrode 9 and the second gate region 32 is set large—this can be done by decreasing the thickness of the gate oxide film 36, by increasing the effective area of the MOS capacitor, or by using a ferroelectric material for the gate oxide film 9, for instance. In the above-said operation mode, the second gate region 32 may be electrically shorted to the cathode region 2 or may also be held floating.

When the application of the turn-ON gate pulses is stopped, the second gate region 32 is charged substantially negative. The reason for this that negative charges are stored in the second gate region 32 corresponding to the quantity of holes injected therefrom. Since the second gate region 32 is thus negatively biased, the injection of electrons from the cathode region 2 is prevented. In the latch-up mode, however, an overwhelmingly large quantity of hole current flows into the second gate region 32 as well, the main thyristor remains in the ON state. In the non-latch-up mode, the main thyristor is turned OFF. To ensure turning-OFF of the main thyristor, negative pulses are applied to the insulated gate control gate electrode 9.

To stop the hole injection from the anode region I after the electron injection from the cathode region 2 has also been stopped by the restoration of the potential barrier at the point G * to its original height by the application of the negative bias to the insulated gate control gate electrode 9, it is preferable to extinguish the electrons stored near the anode side through structural or lifetime control in combination with the use of a structure which stops the hole injection from the anode region 1 (an anode short, double gate structure, for instance) or hole lifetime control.

Since the first gate region 31 is always electrically shorted to the cathode region 2, holes near the first gate region 31 are liable to be absorbed by the first gate region 31. Hence, the hole storage effect near the cathode region 2 and the first gate region 31 do not matter. Furthermore, since there is no potential difference between the first gate region 31 and the cathode region 2, the width of the depletion layer between them is substantially constant and the capacitance between them undergoes no substantial change. On the other hand, the width $W_1$ of the depletion layer spreading from the first gate region 31 toward the anode region I undergoes a substantial change with the voltage condition of the latter. This change causes a substantial change in the capacitance between the first gate region 31 and the anode region I as well, but it is desirable to prevent this capacitance variation from exerting an influence on the anode side.

In the insulated gate static induction thyristor with a shorted cathode structure according to the present invention, the anode-to-cathode current that is controllable through the insulated gate control gate electrode 9 formed above the second gate region 32 can be increased substantially through utilization of the merit of the first gate (or short-circuit gate) region 31 which acts as a region for absorbing holes. By this, the maximum controllable current/voltage durability can be enhanced. Besides, the quantity of holes that are injected from the insulated gate control gate electrode 9 is essentially very small, and the quantity of carriers (holes) stored near the cathode region 2 during the ON period is also made smaller by the provision of the short-circuit gate 31 than in the case of employing the common gate structure. Hence, the quantity of holes to be absorbed by the second gate 32 during the turn-OFF period is so small that the turn-OFF capability or performance can be improved. It is also expected, as another advantage of the split gate structure, that the turn-ON switching capability of performance is improved by the reduction of the gate input capacitance owing to the introduction of the MOS gate structure. Further, since the short-circuit gate 31 and the insulated gate control gate electrode 9 can be isolated completely from each other, current control by the insulated gate control gate electrode 9 can be effected completely independently of the short-circuit gate 31.

[Embodiment 1]

The structure shown in FIG. 1 is a basic structure of the present invention, but it can be used as a planar gate structure (Embodiment 1) by forming the first and second gate regions 31 and 32 as pn junction gates and the anode region 1 as a p+-type region. FIG. 1 schematically illustrates, in section, the insulated gate static induction thyristor with a split gate type shorted cathode structure according to the first embodiment of the present invention. In Embodiment 1 the auxiliary cathode region 21, described later, is not positively formed. The cathode region 2 is formed intermediate between the first gate region 31, and the second gate region 32. The cathode region 2 has a stripe or dot pattern. The first and second gate regions 31 and 32 are identical in shape and formed, as a planar gate structure, by the diffusion of boron (B) or the like or by ion implantation. In the FIG. 1 embodiment, the width of the channel that is controlled by the second gate region 32 covered with the insulated gate control gate electrode 9 is about half of the channel width in the case of using the common gate. Hence, the quantity of electron current from the cathode region 2 during the turn-ON period is smaller than in the case of using the common gate. Since the triggering sensitivity of the insulated gate type static induction thyristor (the current gain at the time of turnON operation) is so high that a required quantity of hole current can be drawn from the anode side with a very small amount of electron current. Hence, the turn-ON capability or performance can sufficiently be secured with no appreciable influence on the turn-ON period. In the example of FIG. 1 the p-type second gate region 32 is not electrically shorted to the cathode region 2.

A structural feature of the FIG. 1 embodiment resides in the insulated gate control gate electrode 9. Theoretically, the insulated gate control gate electrode 9 needs only to have a construction that forms a MOS capacitor structure between it and the second gate electrode region 32. That is, the capacitive coupling of the positive voltage that is applied to the control gate electrode 9 makes the potential of the second gate region 32 positive, decreasing the width $W_2$ of the depletion layer or reducing the static induction barrier height at the intrinsic gate point G*. As a result, electrons are injected in sufficient quantity from the cathode region 2 into the high-resistivity layer 5 near the anode region I and stored in the interface between them, while at the same time holes are injected from the anode region 1 into the high-resistivity layer 5. The holes from the anode region I are partly stored in the second gate region 32, charging the MOS capacitor and causing further electron injection. The remaining holes flow into the first gate region 31 shorted to the cathode region 2 and the cathode short-circuit gate electrode 10. Moreover, the holes stored in the second gate region 32 partly flow into the cathode region 2 and thence to the cathode electrode 8. As the potential of the second gate region 32 goes higher in the positive direction, a potential difference is induced between the first and second gate regions 31 and 32. Hence, in this instance, the holes stored in the second gate region 32 flow into the first gate region 31 as well. The region near the point G *, particularly depleted, essentially forms a channel region for the hole current between the second and first gate regions 32 and 31.

In the case where the insulated gate control gate electrode 9 forms the MOS capacitor between it and the second gate region 32, its capacitance may preferably be as large as possible, because it is desirable, from the viewpoint of controllability, that the potential of the second gate region 32 by the capacitive coupling be as high as possible.

In the case where the insulated gate control gate electrode 9 formed on the insulating layer 36 is extended from one end of the cathode region 2 to the high-resistivity layer 5 across the second gate region 32 as shown in FIG. 1. it is possible to produce not only an effect of simple MOS capacitor coupling drive but also an effect that electrons are injected from the cathode region 2 into the high-resistivity layer 5 through an n-type MOS channel of a lateral n-channel MOSFET formed by an n+(2)n–(5) p(32)n–(5) structure (FIG. 1).

The insulated gate control gate electrode 9 may be formed over a part of the cathode region 2 or the first gate region 31 as well as over the second gate region 32. The use of such a structure facilitates the MOS capacitor drive and permits the formation of the equivalent n-channel MOSFET across the first gate region 31 as shown in FIG. 1.

At the time of turn-OFF operation, a negative voltage pulse needs only to be applied to the insulated gate control gate electrode 9. The capacitive coupling of the negative voltage pulse makes the potential of the second gate region 32 negative and the potential barrier height at the point G* also increases in the direction to hinder the injection of electrons. The n-MOS channel of the equivalent n-channel MOSFET is also cut off, and hence the electron injection through the n-MOS channel is also inhibited. The higher the potential barrier at the point G * becomes, the more electron injection from the cathode region 2 is blocked and the lower the static induction potential barrier (present at the point G*) against holes between the first and second gate regions 31 and 32 becomes. Upon cutting off the positive gate pulse applied during the ON state of the thyristor, the second gate region 32 is charged negative-this depends on the quantity of holes injected into the high-resistivity layer 5 by the positive voltage pulse. When the second gate region 32 becomes negatively charged, the potential at the point G * rises acts in the direction to turn OFF the thyristor. In the latch-up mode, however, an overwhelmingly large quantity of hole current flows into the second gate region as well, keeping the main thyristor in the ON state. In the non-latch-up mode, the main thyristor is turned OFF. At the same time, the potential barrier against holes at the point G* reduces, facilitating the injection of holes from the first gate region 31. Ultimately the equilibrium of holes and electrons are established, that is, the OFF state of the thyristor in which no hole current flows between the first and second gate regions 31 and 32 nor does an electron current flow from the cathode region 2.

Figure 2:
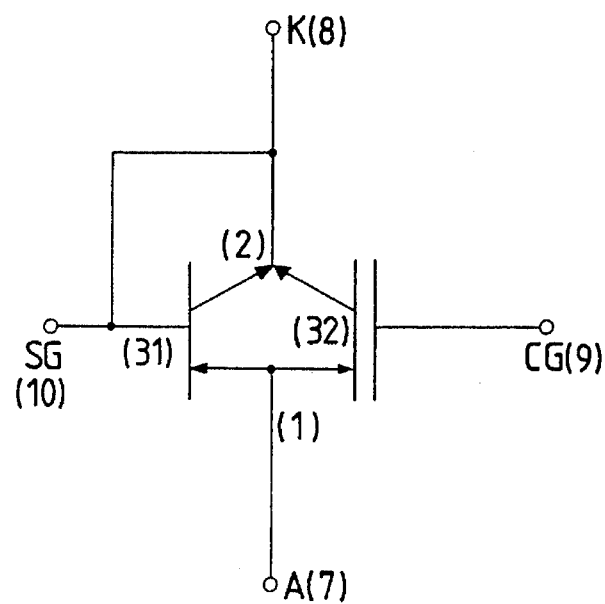
FIG. 2 is a schematic circuit representation of the insulated gate static induction thyristor of FIG. 1.

FIG. 2 is a schematic circuit representation of the insulated gate static induction thyristor with a split gate type shorted cathode structure shown in FIG. 1. The thyristor of the FIG. 1 can be represented as a parallel connection of an SI thyristor with a cathode short-circuit gate of a pn junction gate structure (SG) and a gate SI thyristor. The n-MOS channel represents a channel in the MOS interface formed by an n(2)p(32)n–(5) structure.

In FIG. 1 the anode region 1 is shown to be formed as a flat and uniformly thick structure, in the interests of simplicity and clarity. Of course, it is possible to employ, for the anode side, a shorted anode structure, an SI short structure (Japanese pat. Laid-Open No. 93169/89), a structure with a buffer, a structure with an SI buffer (Japanese Pat. Appln. No. 114140/92), a structure with a drift buffer (Japanese Pat. Appln. No. 144887/92), or a planar or buried double gate structure.

[Embodiment 2]

Figure 3:
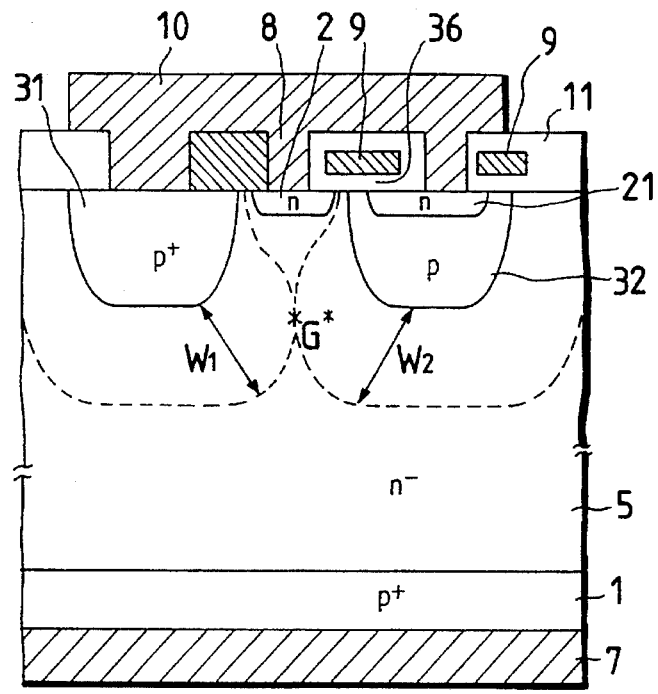
FIG. 3 is a sectional view schematically illustrating a second embodiment of the insulated gate static induction thyristor according to the present invention.

FIG. 3 illustrates, in section, the insulated gate static induction thyristor with a split gate shorted cathode structure according to a second embodiment of the present invention. The FIG. 3 embodiment has its feature in that the first and second gate regions 31 and 32 have different impurity concentrations so as to separate their functions and in that the auxiliary cathode region 21 is provided in the second gate region 32. That is, the first gate (or shielding gate) region 31, which functions as the cathode short-circuit gate, is formed as a p+ region whose impurity concentration differs from that of the second gate region 32 formed as a p-type region. The cathode region 2 and the auxiliary cathode region 21 formed in the second gate region 32 are interconnected via the cathode electrode 8. The reason why the impurity concentration of the first gate region 31 is set high is that the built-in potential between the first gate region 31 and the high-resistivity layer 5 can be made higher than the built-in potential between the second gate region 32 and the high-resistivity layer 5, with the result that minority carriers (holes) near the cathode region 2 are more readily absorbed by the first gate region 31. The high impurity concentration of the first gate region 31 facilitates the flow of the hole current from the anode region 1 into the first gate region 31. heightening the cathode shorting effect. The electrical shorting of the first gate region 31 to the cathode region 2 and the auxiliary cathode region 21 allows efficient absorption of holes by the first gate region 31. Under the action of the insulated gate control gate electrode 9, the second gate region 32 acts as a channel that controls the electron injection from the cathode region 2 and the auxiliary cathode region 21, and during the ON and OFF periods it conducts only a smaller quantity of hole current than does the first gate region 31. Besides, since the insulated gate control gate electrode 9 has a MOS structure, the thyristor can be turned ON and OFF with a very small quantity of current-this lightens the burden on the second gate region 32. A structural feature of this embodiment lies in the provision of the auxiliary cathode region 21 in the second gate region 32. By extending the insulated gate control gate electrode 9 over a region [n(2)n–(5)p(32)n(21)p(32)n(5)] with the gate oxide film 36 interposed therebetween, it is possible to form an n-channel MOSFET of an essentially short channel length. That is, when the auxiliary cathode region 21 is not present, the equivalent n-channel MOSFET has a channel length equal to the width of the second gate region 32. In the second embodiment (FIG. 3) which has the auxiliary cathode region 21 formed in the second gate region 31, however, the width of the second gate region 2 is reduced by the auxiliary cathode region 21, and hence the gate channel is essentially short, thus, a short channel structure is implemented. This permits high-speed ON-OFF operation of the thyristor. Another advantage by the auxiliary cathode region 21 resides in that while the positive voltage is being applied to the insulated gate control gate electrode 9, an n-channel inversion layer is formed in the n-type MOS interface, enabling the area of the cathode region (2, 21) to be set large. By this, the electron current capacity from the cathode can be set large, making it possible to increase the current capacity of the main thyristor. In FIG. 3, the n-MOS channel can be formed as an [n(2)n–(5) p(31)n–(5)] structure by extending the insulated gate control gate electrode further to the above of the first gate region 31. This provides another channel through which electrons essentially flow.

Figure 4:
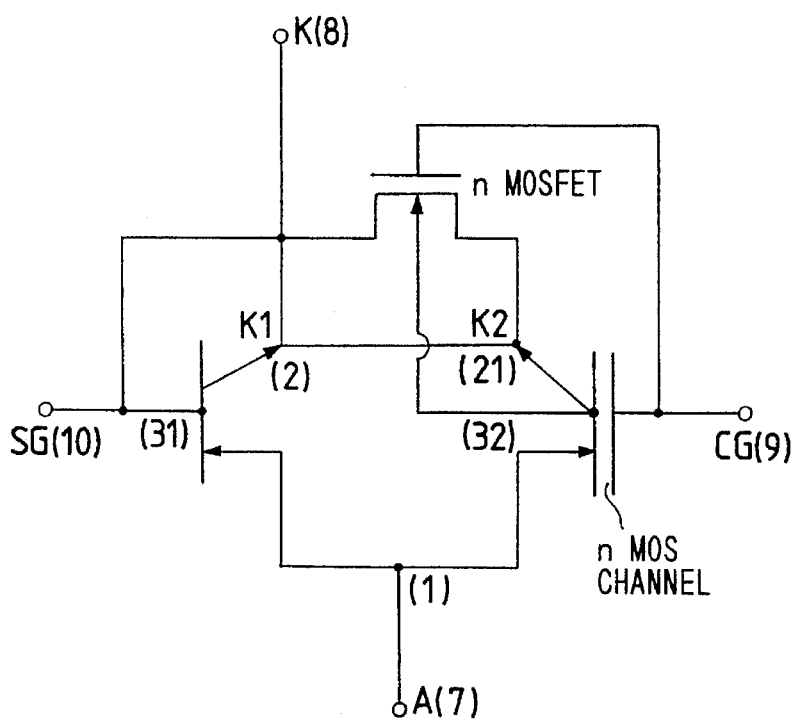
FIG. 4 is a schematic circuit representation of the thyristor of FIG. 3.

FIG. 4 is a schematic circuit representation of the FIG. 3 embodiment. The basic structure of the embodiment needs only to have the cathode region 2 as the cathode and does not need the auxiliary cathode region 21. The split gate type structure can be regarded as a parallel arrangement of two thyristors. The cathode region 2 and the auxiliary cathode region 21 can be considered as source and drain regions of an n-MOSFET. In operation, electrons injected from the auxiliary cathode region 21 into the high resistivity layer 5 are stored in the cathode region 2; hence the auxiliary cathode region 21 can be regarded as the actual cathode region. That is, the auxiliary cathode region 21 is contained by the second gate region 32, but an n-channel inversion layer of the equivalent MOSFET is formed by the action of the insulated gate control gate electrode 9, then a uniform cathode region can be regarded as if extended to the auxiliary cathode region 21. With the formation of the auxiliary cathode region 21, the subsequent conduction state of the thyristor can be considered to be the same as in the case of the pn junction gate static induction thyristor. The MOS gate structure is intended to provide complete isolation between the first gate (or short-circuit gate) region 31 and the insulated gate control gate electrode 9, which is impossible with the conventional split gate type structure with pn junction gates.

In FIG. 4, the pn junction gate static induction thyristor has the gate (SG, 10) shorted to the cathode region 2, whereas the insulated gate static induction thyristor is controlled by the control gate (CG, 9) (MOS). Taking the auxiliary cathode region 21 into consideration, it will be seen that an n-MOSFET of a lateral structure [n+ (2)p(32)n–(5)n+ (21)] is formed. The auxiliary cathode region 21 is further controlled by the second gate region 32, and it can be regarded as a cathode region of the gate static induction thyristor. Further, since the high resistivity layer 5 between the first and second gate regions 31 and 32 is virtually depleted, they can be considered to be capacitively coupled to each other.

In FIG. 3, the insulated gate control gate electrode 9 can also be extended to the above of the first gate electrode 31. In this instance, the equivalent n-MOS channel is formed across the first gate region 31. As is the case with the first embodiment, the shorted anode structure, the buffer structure, or the double gate structure can be used for the anode side.

[Embodiment 3]

Figure 5:
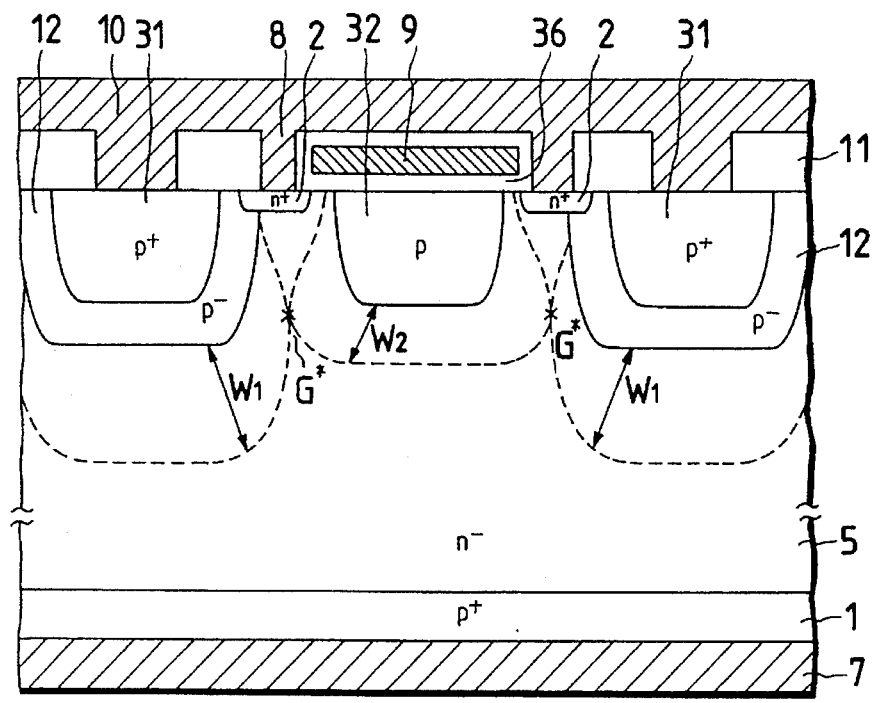
FIG. 5 is a sectional view illustrating a third embodiment of the present invention.

FIG. 5 illustrates, in section, the insulated gate static induction thyristor with a split gate type shorted cathode structure according to a third embodiment of the present invention. In this embodiment, to further ensure isolation between the first and second gate regions 31 and 32, the first gate region 31 is formed by a combination of p+-type region (31) and a p--type region (32), whereas the second gate region is formed by a p-type region (32). The cathode region 2 is provided at either side of the second gate region 32 to enhance the controllability of the cathode current by the insulated gate control gate electrode 9 formed above the second gate region 32. The low impurity concentration gate region 12 is intended to form the first gate region 31 to a large depth to permit absorption of holes in a deeper and wider region, and its another function is an electric field buffer layer. It is apparent that the shorted structure, the buffer structure, etc. can be used for the anode region 1.

[Embodiment 4]

Figure 6:
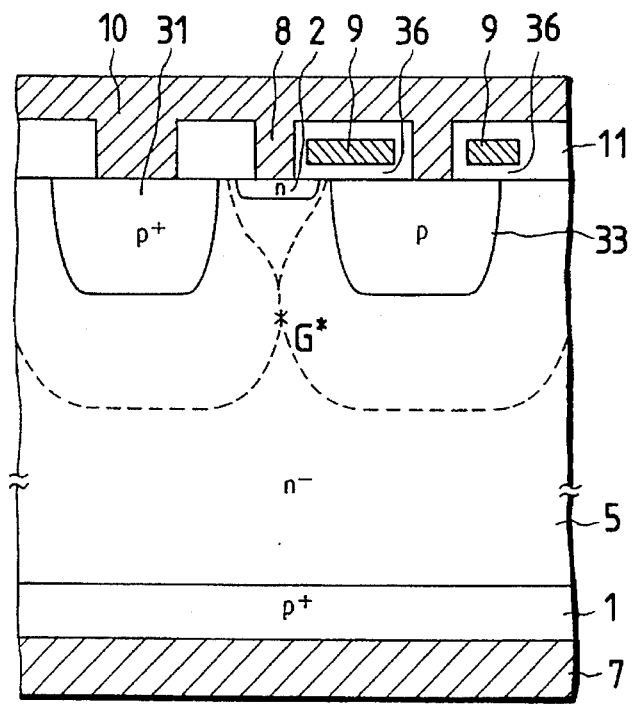
FIG. 6 is a sectional view illustrating a fourth embodiment of the present invention.

FIG. 6 illustrates, in section, the insulated gate static induction thyristor with a split gate type shorted cathode structure according to a fourth embodiment of the present invention. In this embodiment, the cathode region 2 is formed between the first and second gate regions 31 and 32, and the first gate region 31 is formed with an impurity concentration higher than that of the second gate region 32. Moreover, the cathode electrode (or short-circuit gate electrode) 10 is formed in contact with the second gate region 32 so that the latter is equipotential with the first gate region 31 and the cathode region 2. The insulated gate control gate electrode 9 is disposed on the structure [ n+(2) n–(5)p(32)n– (5)], permitting the formation of an n-MOS channel at the time of turning-ON of the thyristor. The operation of this embodiment can be considered to the same as in Embodiments I through 3.

[Embodiment 5]

Figure 7:
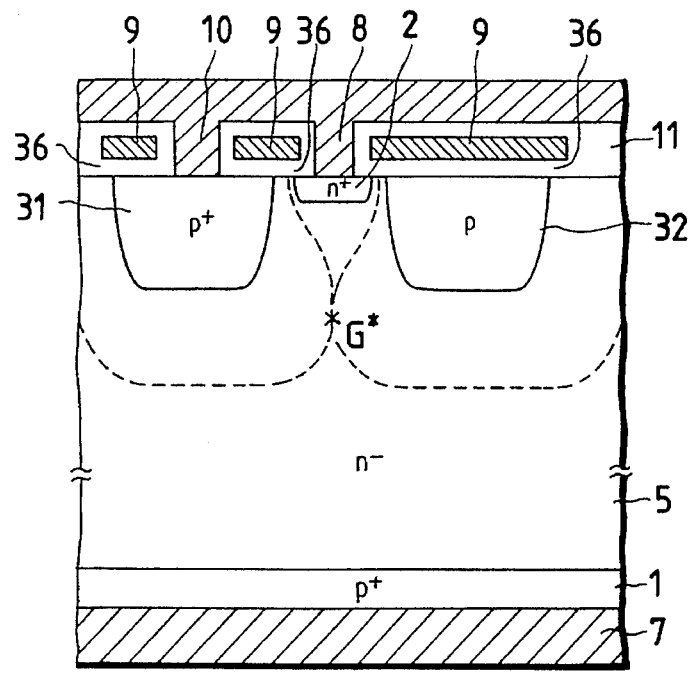
FIG. 7 is a sectional view schematically illustrating a fifth embodiment of the present invention.

FIG. 7 illustrates, in section, the insulated gate static induction thyristor with a split gate type shorted cathode structure according to fifth embodiment of the present invention. This embodiment differs from the FIG. 1. embodiment in that the insulated gate control gate electrode 9 is also formed above the first gate region 31 with the gate oxide film 36 interposed therebetween. The insulated gate control gate electrode 9 above the second gate region 32 and the insulated gate control gate electrode 9 above the first gate region 31 are formed as an electrically common region. This structure increases the number of channels for an electron current during the turn-ON period. That is. an n-MOS channel is formed in an [n+ (2)n– (5)p+(31)o (5)] structure which is the MOS interface of the first gate region 31, an [ n+(2)n– (5)p(32)n–ʹ (5)] structure which is the MOS interface of the second gate region 32 and an [n+ (2)n– (5)G*o (5)] structure which is an SI channel surrounded by the first and second gate regions 31 and 32.

In FIG. 7, the cathode region 2 is provided in the form of a island, equivalently forming a p-channel MOSFET between the first and second gate regions 31 and 32. This p-channel MOSFET effectively acts particularly when the main thyristor is turned OFF. That is, upon application of the negative pulse voltage to the insulated gate control gate electrode 9, the above-mentioned n-MOS channel is cut off and the SI channel is also cut off. On the other hand, the p-channel MOSFET is turned ON, the first and second gate regions 31 and 32 become equipotential, and extra holes stored in the second gate region 32 are also discharged to the short-circuit gate electrode 10, stopping the electron injection and switching OFF the main thyristor.

Figure 8:
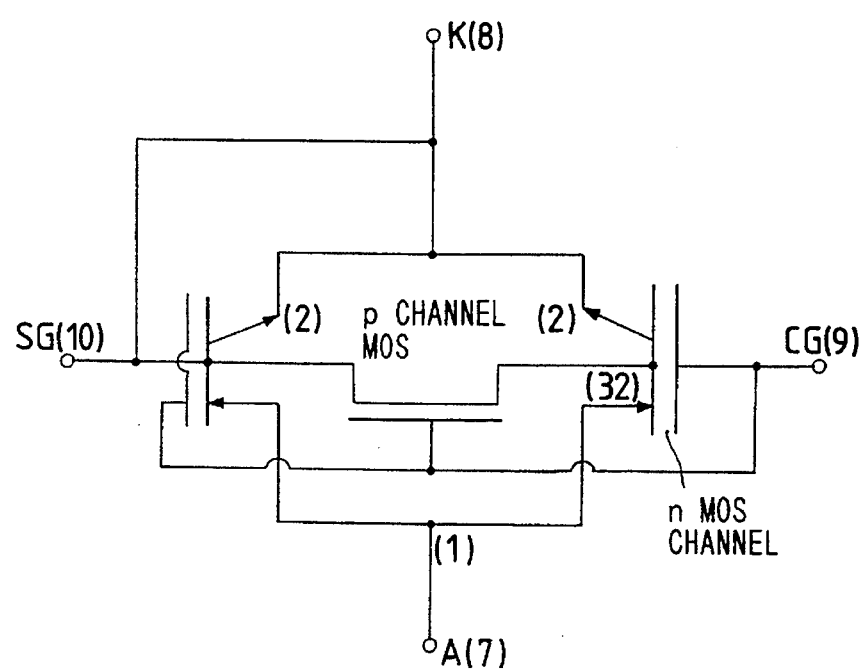
FIG. 8 is a schematic circuit representation of the thyristor of FIG. 7.

FIG. 8 is a schematic circuit representation of the FIG. 7 embodiment, which shows the p-channel MOSFET formed between the first and second gate regions 31 and 32 and in which the n-MOS channel formed above the first and second gate regions 31 and 32 is represented by a MOS capacitor structure.

[Embodiment 6]

Figure 9:
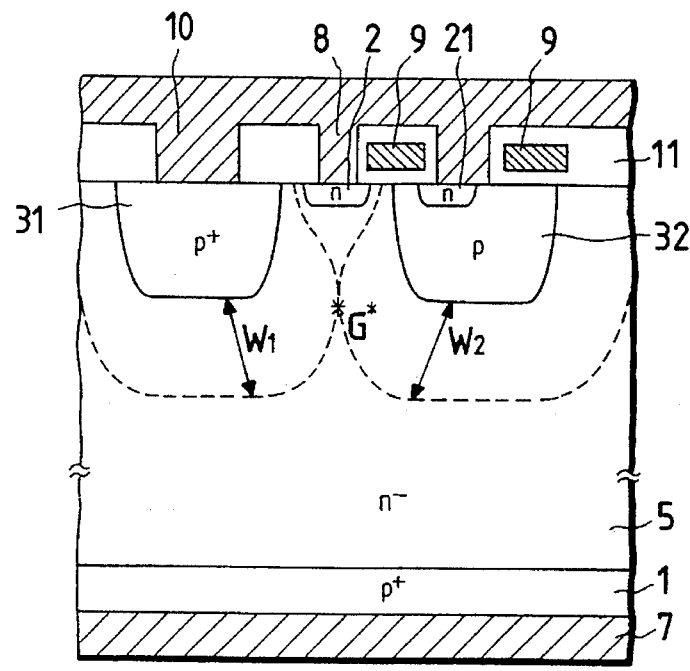
FIG. 9 is a sectional view schematically illustrating a sixth embodiment of the present invention.
Figure 10:
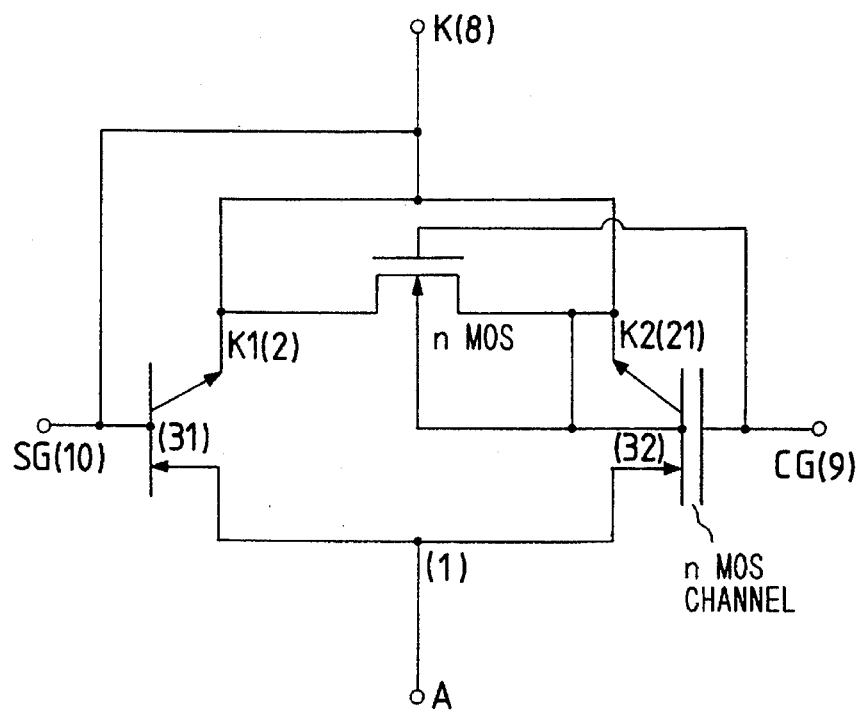
FIG. 10 is a schematic circuit representation of the thyristor of FIG. 9.

FIG. 9 illustrates, in section, the insulated gate static induction thyristor with a split gate type shorted cathode structure according to a sixth embodiment of the present invention. This embodiment has its structural feature in that the auxiliary cathode region 21 is formed in the second gate region 32 to materially reduce the length of the n-MOS channel, that the n+-type cathode region (2, 21) is formed wide, and that the second gate region 32 and the auxiliary cathode region 21 are also electrically shorted. FIG. 10 is a schematic circuit representation of this embodiment. The cathodes K1 (2) and K2 (21) are shorted to the first gate region 31 and the second gate region 32, respectively, and an n-MOSFET is formed between the cathodes K1 (2) and K2 (21). Moreover, a capacitor of an n-MOS- 5-2 channel is formed on the second gate region 32. By making the second gate region 32 equipotential with the cathode short-circuit gate 10, the quantity of holes that are stored in the second gate region 32 is held substantially constant. Hence, the trigger sensitivity of the thyristor at the time of its turn-ON operation is lower than in the case where the second gate region 32 is held floating. It is sufficiently possible, however, to trigger the main thyristor with an electron current that is injected from the cathode region (2, 21) by the n-MOS channel effect. Since the second gate region 32 is stabilized in terms of potential, there are advantages that prevent misfiring of the main thyristor and allow ease in turning it OFF. It is evident it is also possible to introduce in this embodiment a structure which forms a p-MOSFET between the first and second gate regions 31 and 32, as in the case of Embodiment 5. It is also evident that an n-MOS channel may be formed across the first gate region 31.

[Embodiment 7]

Figure 11:
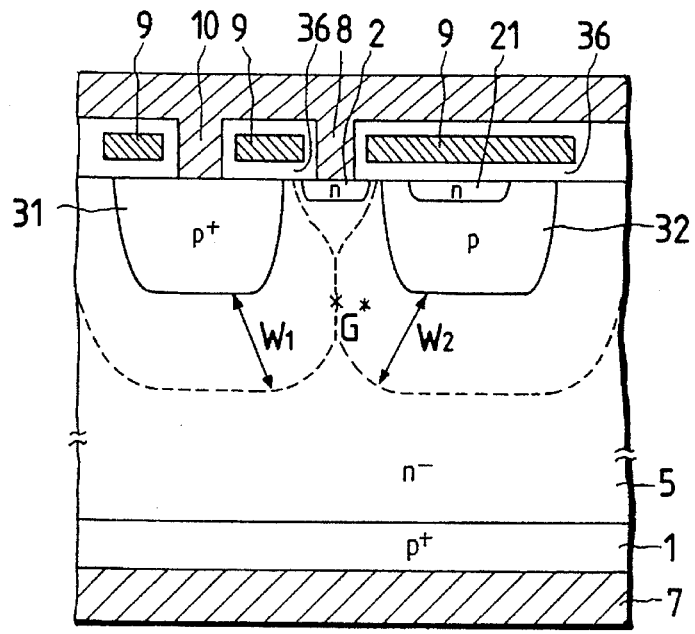
FIG. 11 is a sectional view schematically showing a seventh embodiment of the present invention.
Figure 12:
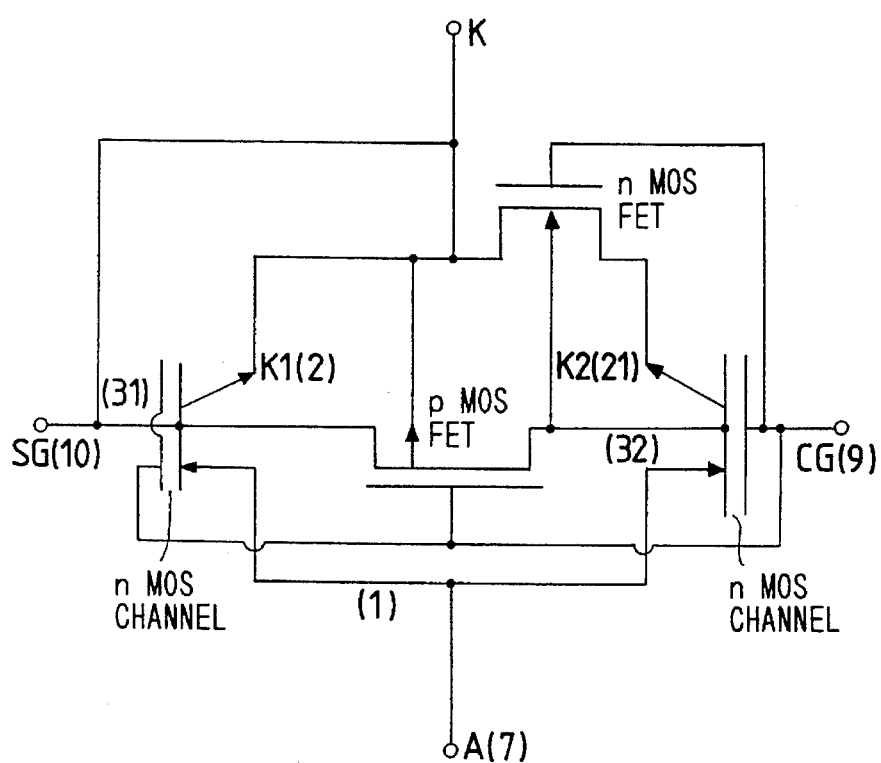
FIG. 12 is a schematic circuit representation of the thyristor of FIG. 11.

FIG. 11 illustrates, in section, the insulated gate static induction thyristor with a split gate type shorted cathode structure according to a seventh embodiment of the present invention. This embodiment is an extended or modified version of the FIG. 5 embodiment, in which the auxiliary cathode region 21 is formed in the second gate region 32. With the provision of the auxiliary cathode region 21, an equivalent n-MOSFET is formed by a structure [n(2)n– (5)p(32)n(21)], and hence the length of the equivalent n-MOS channel [n(2)p(32)n– (5)] is reduced. This speeds up the thyristor turn-ON operation. The potential of the second gate region 32 is capacitively controlled by the potential of the first gate region 31. Further, since an equivalent p-channel MOSFET is formed between the first and second gate regions 31 and 32, it conducts to clear holes stored in the second gate region 32 during the turn-OFF period, as mentioned previously. It is apparent that the formation of the auxiliary cathode region 21 as a floating region as in this embodiment does not present any problem in terms of operation since it conducts via the cathode region 2 and the n-channel MOSFET when the thyristor is turned ON. FIG. 12 is a schematic circuit representation of this embodiment. The p-channel MOSFET is connected between the first and second gate regions 31 and 32, and the n-channel MOSFET is connected between the cathode region K1 (2) and the auxiliary cathode region K2 (21). Moreover, an n-MOS channel capacitor is formed over the first and second gate regions 31 and 32 by the insulated gate control gate electrode 9 with the gate oxide film 36.

[Embodiment 8]

Figure 13:
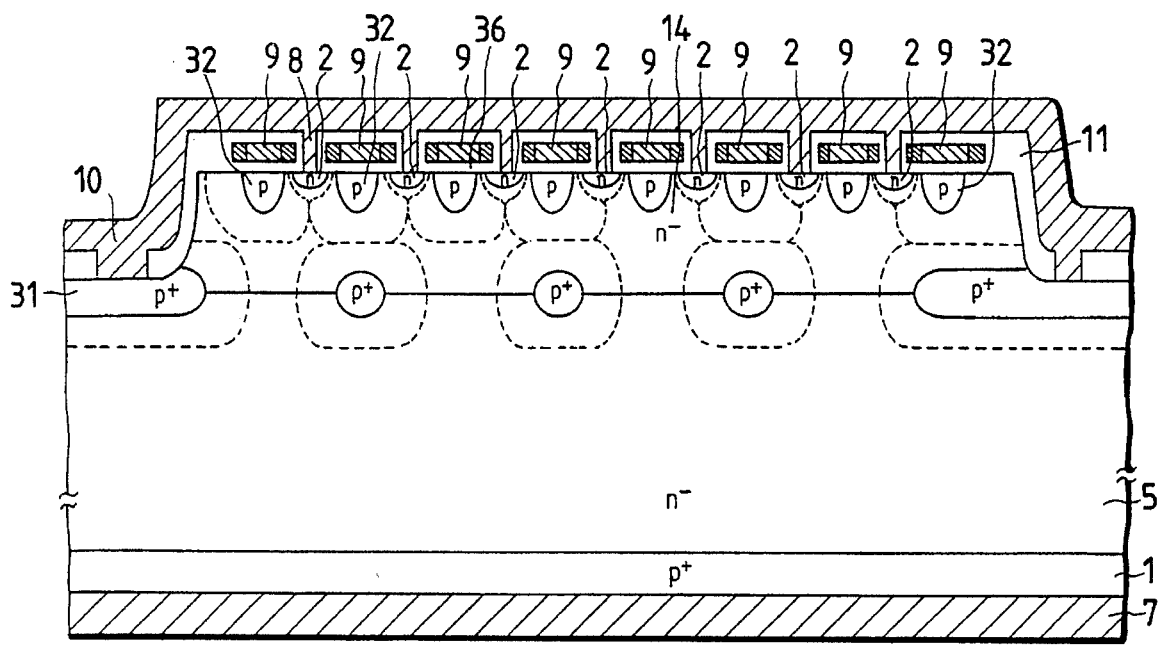
FIG. 13 is a sectional view schematically showing a eighth embodiment of the present invention.

FIG. 13 illustrates, in section, the insulated gate static induction thyristor with a split gate type shorted cathode structure according to a eighth embodiment of the present invention. In this embodiment, the first gate region 31 is provided as a buried gate structure and the second gate region 32 as a planar gate structure. That is, the second gate region 32 is formed by diffusion of boron (B) or the like or ion implantation into the surface portion of an epitaxial growth layer 14. The insulated control gate electrode 9 is provided above the second gate region 32 with the gate oxide film 36 formed therebetween. As is evident from FIG. 13, the insulated gate control gate electrode 9 is formed all over the second gate region 32 with the gate oxide film 36 sandwiched therebetween, and the cathode region 2 is formed between adjacent second gate regions 32. With such an arrangement, upon application of a positive voltage pulse to the insulated gate control gate electrodes 9, an equivalent n-channel MOSFET is formed between adjacent cathode regions 2, making them equipotential. That is, an n-MOS channel [n(2)n– (14)p(32)n–(14)n(2) . . . ] is formed in the surface of the epitaxial layer 14. The cathode regions 2 are each electrically shorted to the first gate region 31 via the cathode short-circuit electrode 10. By setting the channel width relatively wide in the buried structure of the first gate region 31, electrons injected from the cathode region 2 are allowed to flow through the buried channel with ease. Once the electron current and the hole current are secured as predetermined, the main thyristor enters the latch-up state. When the main thyristor is in the ON state, the hole current mostly flows into the first gate region 31, the remaining hole current flowing into the cathode region 2 through the second gate region 32 or directly. The main thyristor can be turned OFF simply by cutting off the positive voltage pulse applied, to the insulated gate control gate electrode 9 or applying thereto a negative voltage pulse. In consequence, the n-MOS channel is cut off and the SI channel adjacent the second gate regions 32 is also cut off, inhibiting the injection of electrons. Accordingly, the hole current also gradually decreases, turning OFF the main thyristor. As described previously, an equivalent p-channel MOSFET may be formed between the second gate regions 32 or between the second gate region 32 and the first gate region 31 so as to facilitate the turn-OFF of the thyristor. This can be done by, for instance, extending the insulated gate control gate electrode 9 to the above of the first gate region 31. In the case where the p-channel MOSFET is formed, the potential of the second gate region easily be controlled by the potential of the first gate region 31. Also in the case where an equivalent p-channel MOSFET is not formed, however, the potential of the second gate region 32 can easily be controlled by the potential of the first gate region 31 through their capacitive coupling. Thus, the holes stored in the second gate region 32 are readily discharged to the cathode short-circuit electrode 10, and hence the main thyristor is stable in operation.

[Embodiment 9]

Figure 14:
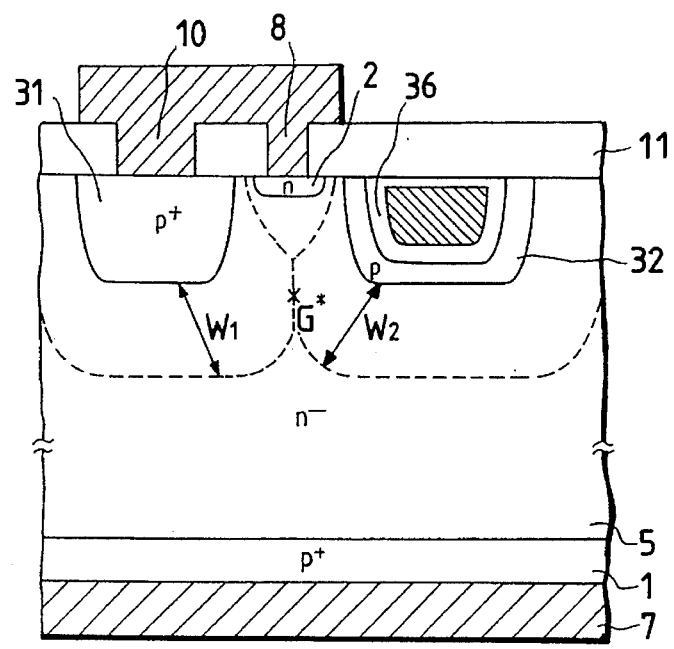
FIG. 14 is a sectional view schematically illustrating a ninth embodiment of the present invention.

FIG. 14 illustrates, in section, the insulated gate static induction thyristor with a split gate type shorted cathode structure according to a ninth embodiment of the present invention. In this embodiment, the second gate region 32 is formed on the side wall and bottom of a U-shape groove and is covered with the MOS gate oxide film 36 to provide a relatively large MOS capacitance, and the insulated gate control gate electrode 9 is formed in the U-shaped groove. The first gate region 31 is formed with an impurity concentration higher than that of the second gate region 32 with a view to increase the quantity of hole current that is absorbed to the first gate region 31. By the MOS capacitor drive, the potential at the point G* drops and the width $W_2$ of the depletion layer decreases, allowing the injection of electrons from the cathode region 2 and turning ON the main thyristor. The thyristor can be turned OFF simply by stopping the application of the positive voltage to the insulated gate control gate electrode or applying thereto a negative pulse voltage. As a result, the injection of electrons from the cathode region 2 is blocked and the hole current also decreases, turning OFF the main thyristor. The potential of the second region 32 is controlled by the potential of the first gate region 31 through their capacitive coupling, as referred to previously.

[Embodiment 10]

Figure 15:
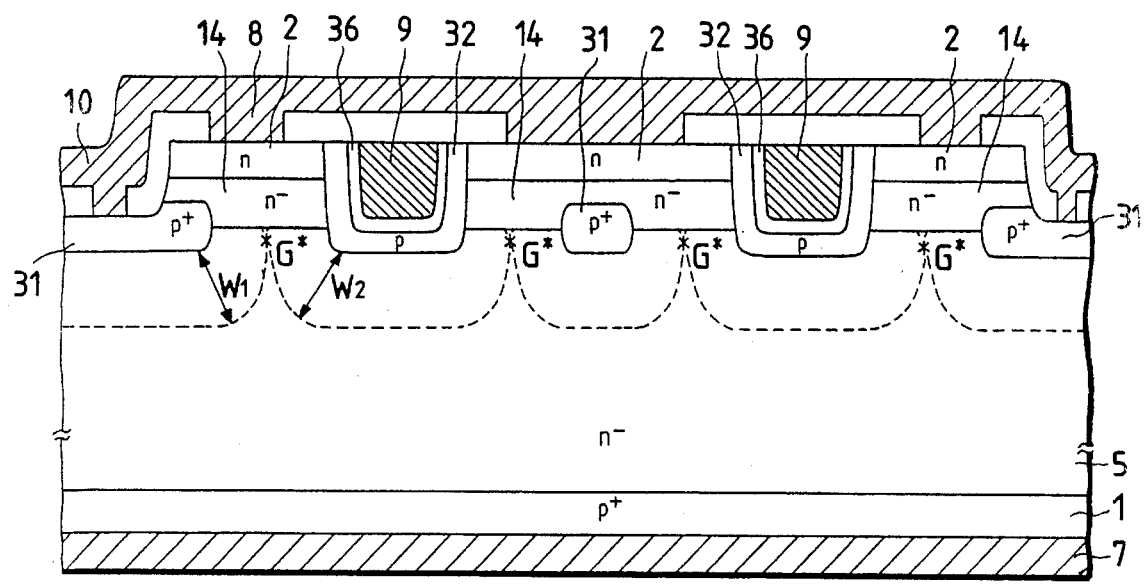
FIG. 15 is a sectional view schematically showing a tenth embodiment of the present invention.

FIG. 15 illustrates, in section, the insulated gate static induction thyristor with a split gate type shorted cathode structure according to a tenth embodiment of the present invention. In this embodiment, the first gate region 31 is formed as a buried structure and the second gate region 32 as a recessed structure as in the FIG. 14 embodiment. The second gate region 32 and the MOS gate oxide film 36 are both formed on the side wall and the bottom of a U-shaped groove, and the insulated gate control gate electrode 9 is formed in the U-shaped groove. The cathode region 2 is provided in the surface of the epitaxial layer 14. Between the first and second gate regions 31 and 32 there are formed depletion layers of the widths $W_1$, and $W_2$, and a static induction potential barrier is formed at the point G * in front of the cathode region 2. The switching operation of the main thyristor is the same as described previously.

[Embodiment 11]

Figure 16:
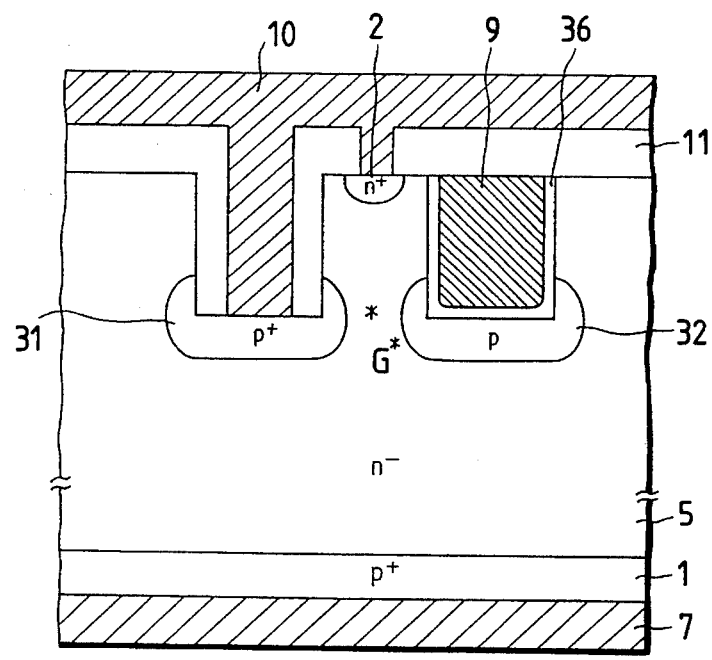
FIG. 16 is a sectional view schematically showing an eleventh embodiment of the present invention.

FIG. 16 illustrates, in section, the insulated gate static induction thyristor with a split gate type shorted cathode structure according to an eleventh embodiment of the present invention. In FIG. 16 the first and second gate regions 31 and 32 are each formed on the bottom of a U-shaped groove. As shown, the first gate region 31 is formed by diffusion and spreads vertically and laterally from the bottom of the U-shaped groove. The second gate region 32 is similarly formed and the insulated gate control gate electrode 9 is formed on the gate oxide film 36 in the U-shaped groove to form a MOS structure. The structure of this embodiment can be considered as a modification of the planar structure of FIG. 1 into a recessed gate structure. The turn-ON operation of the main thyristor is performed by the MOS capacitor drive. The turn-OFF operation is the same as described previously.

[Embodiment 12 and 13]

Figure 17:
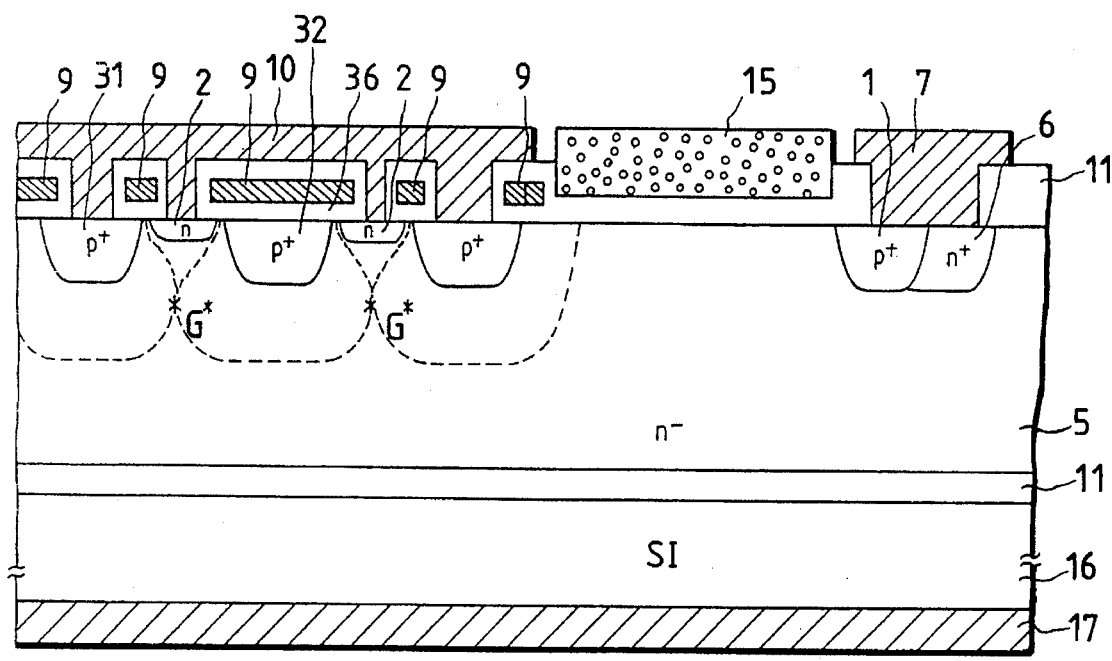
FIG. 17 is a sectional view schematically showing a twelfth embodiment of the present invention.
Figure 18:
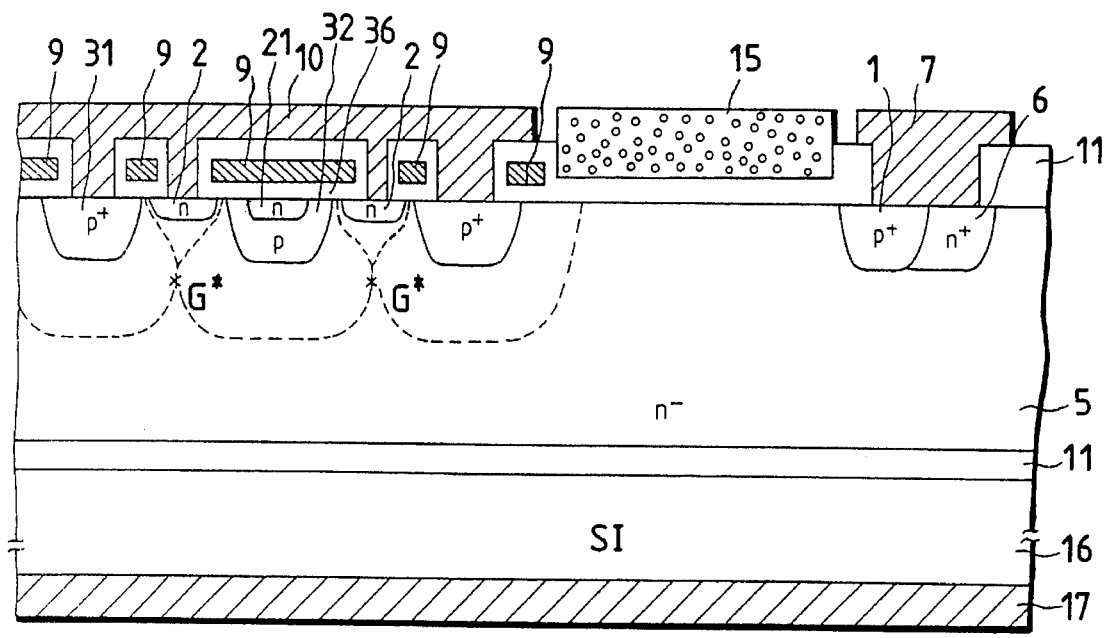
FIG. 18 is a sectional view schematically showing a thirteenth embodiment of the present invention.

FIG. 17 and 18 illustrate, in section, the insulated gate static induction thyristor with a split gate type shorted cathode structure according to twelfth and thirteenth embodiments of the present invention respectively. In either embodiment, the device is formed laterally in a single crystal island region (the high-resistivity layer 5) defined by an insulating layer 11 in a dielectric isolated (DI) substrate or semi-insulating substrate 16.

In FIG. 17 there is shown the static induction thyristor of a lateral structure formed in the high-resistivity layer 5. This structure is the same as that used in the FIG. 7 embodiment. That is, the insulated gate control gate electrode 9 is extended all over the second gate region 32 and to the above of the first gate region 31, with the insulating layer 36 interposed therebetween. The anode region I is shorted to the anode short-circuit region 6 via the anode electrode 7. Reference numeral 15 denotes an SIPOS film deposited on the insulating layer 11 to stabilize the high intensity electric field distribution in the lateral direction between the cathode and anode regions 2 and 1. Reference numeral 17 denotes a back electrode.

In FIG. 18 the auxiliary cathode region 21 is provided in the second gate region 32 in addition to the structure of FIG. 17. This structure is the same as that of FIG. 11 embodiment. Since the length of the n-MOS channel is reduced, the main thyristor can be driven at high speed and the current capacity also increases. Consequently, the controllability of the electron current from the cathode region 2 by the insulated gate control gate electrode 9 is enhanced, and the first gate region 31 is allowed to absorb a larger number of holes, by the difference in impurity concentration between the first and second gate regions and the position of the first gate region 31. Thus, the minority carrier storage effect is suppressed so much that the switching performance or capability is improved and the maximum controllable current/voltage durability is increased.

In Embodiments 12 and 13 depicted in FIGS. 17 and 18, since the device structure is a lateral version of the planar structure, it must be made multi-channel in the case of setting the current capacity to a large value.

[Embodiment 14]

Figure 19:
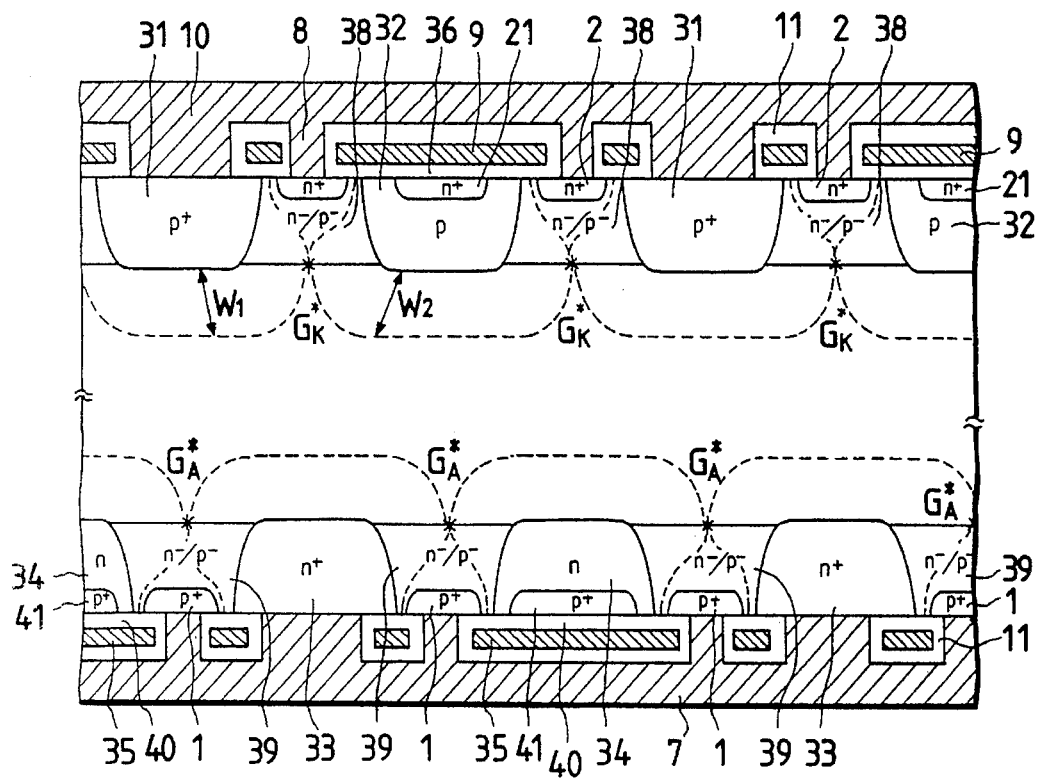
FIG. 19 is a sectional view schematically showing a fourteenth embodiment of the present invention.

FIG. 19 schematically illustrates, in section, the insulated gate static induction thyristor with a split gate type shorted cathode structure according to a fourteenth embodiment of the present invention. As will be seen from FIG. 19, this embodiment has a double gate structure, wherein the p-type gate region (31, 32) at the cathode side and the n-type gate region (33, 34) at the anode side each have a split gate structure. In this embodiment, it can be considered that the structure of Embodiment 7 is formed as a multi-channel structure at the cathode side. The same is true of the anode side structure. That is, the first gate region (p+-type) 31 is shorted to the cathode region (n+-type) 2 via the short-circuit electrode 10, whereas the second gate (p-type) region 32 is covered with the insulated gate control gate electrode 9 separated therefrom by the gate oxide film 36. The first gate region (n+-type) 33 at the anode side is shorted to the anode region I via the anode electrode 7, whereas the second gate region (n-type) 34 at the anode side is covered with a second insulated gate control gate electrode 35 separated therefrom by a gate oxide film 40. Reference numeral 21 denotes an auxiliary cathode region and 41 an auxiliary anode region (p+-type). The double gate thyristor of this embodiment is ON-OFF controlled via the insulated gate control gate electrode 9 and the second insulated gate control gate electrode 35. The first insulated gate control gate electrode 9 is used to control n- and p-MOS structures and the second insulated gate control gate electrode 35 is similarly used to control p- and n-MOS structures. The first gate region 33 at the anode side is shorted to the anode region I via the anode electrode 7 with a view to absorbing electrons which are minority carriers near the anode region 1. Since the electrons near the anode region I are absorbed by the anode-side first gate region 33 and holes near the cathode region 2 are absorbed by the first gate region 31, the thyristor of this embodiment is virtually free from the minority carrier storage effect, and hence is very high in switching speed. The holes injected from the anode side mostly flow to the first gate region 31, whereas the electrons injected from the cathode side mostly flow to the anode-side first gate region 33. Since such an effect of the shorted gate structure is provided at both of the cathode side and the anode side, the maximum controllable current/voltage durability is also high. In FIG. 19, n-/p-type layers 38 and 39 are high-resistivity epitaxial layers, which are formed thin independently of the high-resistivity layer 5. The capacitive coupling between the first and second gate regions is taken into consideration in this case, too.

[Embodiment 15]

Figure 20:
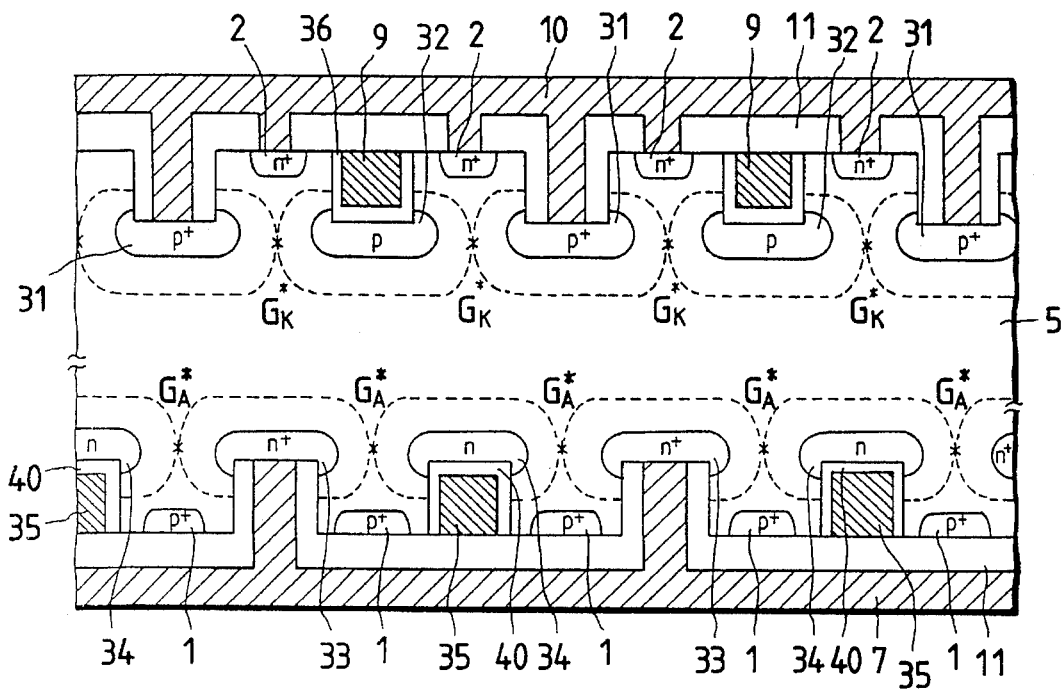
FIG. 20 is a sectional view schematically showing a fifteenth embodiment of the present invention.
Figure 21:
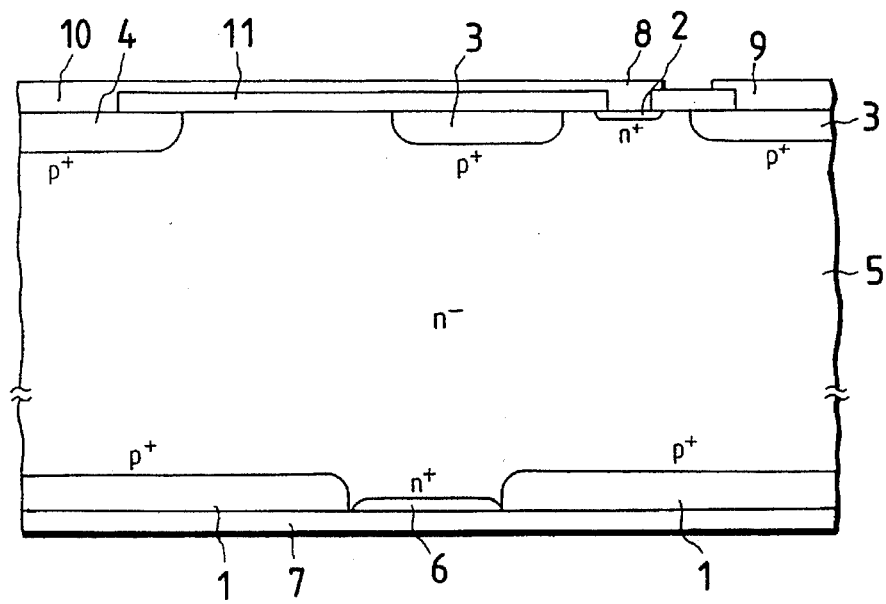
FIG. 21 is a sectional view schematically showing a conventional static induction thyristor with a double emitter-shorted structure.
Figure 22:
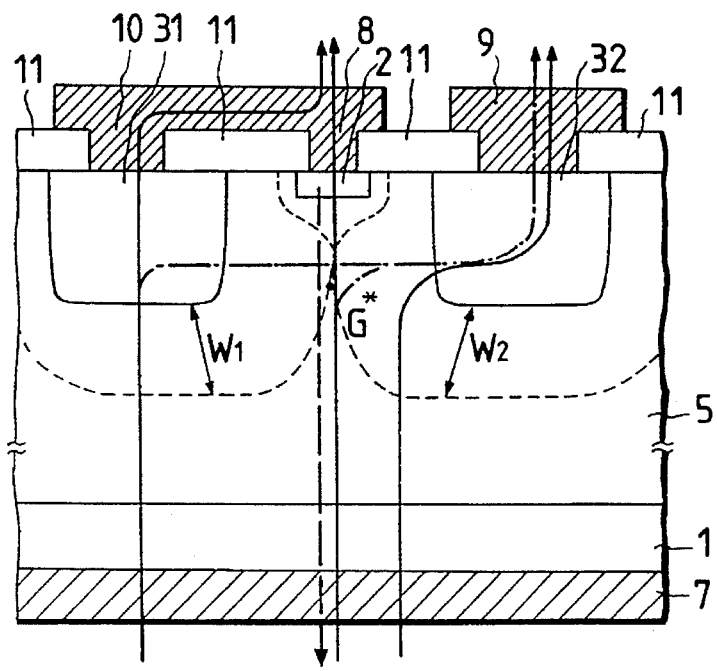
FIG. 22 is a schematic diagram for explaining the principle of operation of a conventional static induction thyristor with a split gate type shorted cathode structure.
Figure 23:
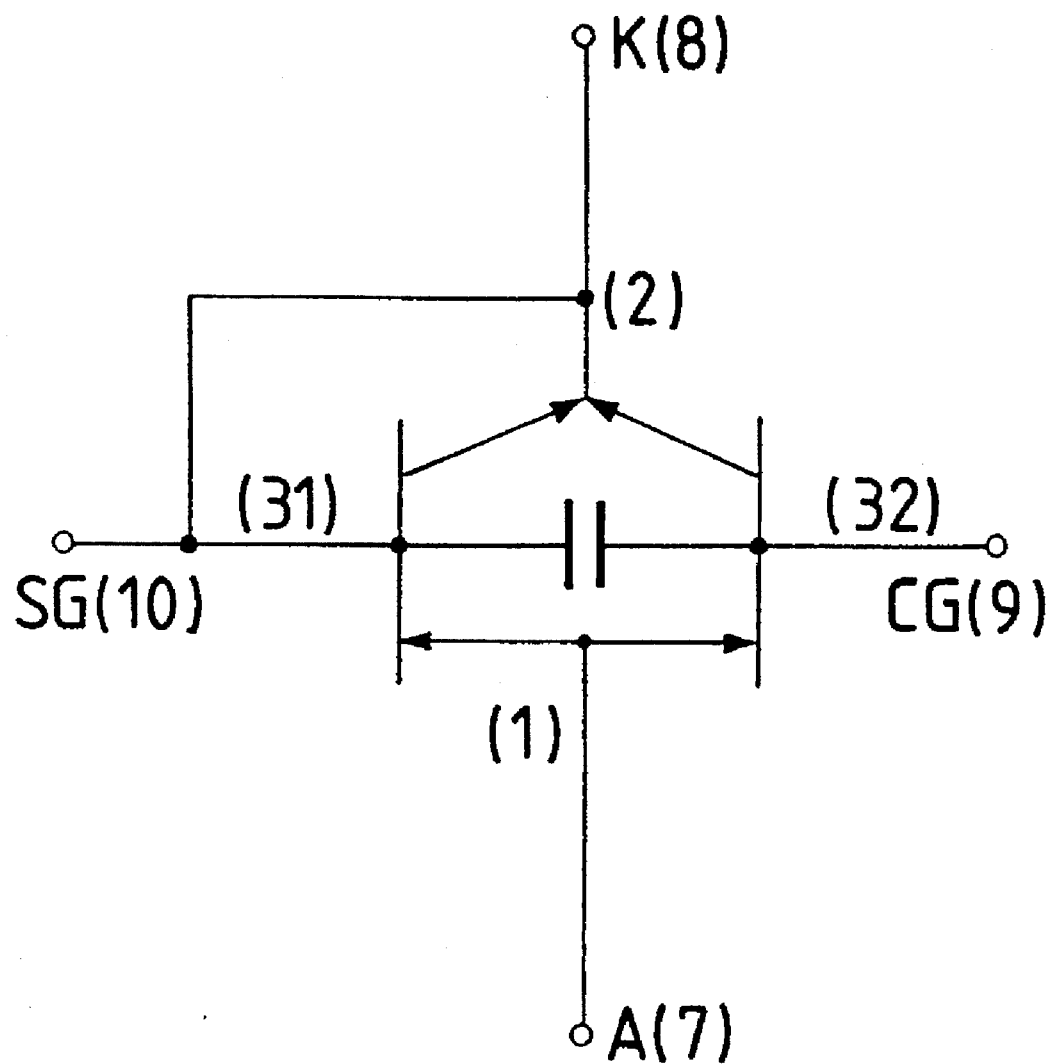
FIG. 23 is a schematic circuit representation of the conventional static induction thyristor depicted in FIG. 22.

FIG. 20 schematically illustrates, in section, the insulated gate static induction thyristor with a split gate type shorted cathode structure according to a fifteenth embodiment of the present invention. In contrast to Embodiment 14 which employs the planar structure for both of the anode-side gate and the cathode side gate, this embodiment uses the recessed gate structure for every gate. It can be considered that the same structure as shown in FIG. 16 is formed at the cathode side. The gate at the cathode side is composed of the first gate (p+-type) region 31, the second gate (p-type) region 32 and the insulated gate control gate electrode 9, whereas the gate at the anode side is composed of the first gate (n+-type) region 33, the second gate (n-type) region 34 and the insulated gate control gate electrode 35. The first gate region 31 is shorted to the cathode region 2 via the cathode short-circuit electrode 10, and the second gate region 32, the insulating film 36 and the control gate electrode 9 constitute a vertical insulated gate structure. The anode-side first gate region 33 is shorted to the anode region I via the anode electrode 7, and the anode-side second gate region 34, the insulating film 40 and the second control gate electrode 35 constitute a vertical MOS structure.

Embodiments 14 and 15 employ the split gate type shorted anode structure in combination with the split gate type shorted cathode structure. By implementing, at either of the anode side and the cathode side, the structure wherein one of the two split gate regions is shorted to the main electrode to form a shorted gate electrode and the other is formed as a true current control electrode of the MOS structure, the minority carrier (holes and electrons) storage effect is suppressed to permit high speed switching of the thyristor, besides the maximum controllable current/voltage durability is increased by the shorted cathode and shorted anode structures.

The present invention is not limited specifically to Embodiments I through 15 described above but various modifications and extensions may be effected by setting the number of channels, gate dimensions, thicknesses of the high-resistivity layers and the epitaxial layers, etc. in accordance with desired current capacity and withstand voltage.

The semiconductor material for implementing the present invention is not limited specifically to silicon either; it is a matter of course that GaAs, InP and similar materials can be used.

Moreover, it is apparent that a buffer structure, an SI buffer structure, a shorted structure, an SI shorted structure and an ordinated double gate structure may be introduced into the anode side. Of course, these structures may also be combined with carrier lifetime control techniques such as irradiation with electron beam, protons or gamma rays, or diffusion of heavy metals (Au, Pt, etc.). It is evident that a lifetime distribution may be set vertically in the high-resistivity layer 5 by using these techniques in combination.

As described above, the insulated gate static induction thyristor with a split gate shorted cathode structure of the present invention is very simple in construction. The high channel integration density increases the area efficiency, the introduction of the MOS gate structure in combination with the shorted structure suppresses the minority carrier storage effect to increase the switching speed and the shorted cathode structure increases the maximum controllable current/voltage durability. Moreover, the use of the MOS gate structure permits complete isolation of the short-circuit gate and the insulated gate control gate electrode and hence offers the advantage of enhanced controllability of the control electrode. The structure that has incorporated therein the MOS device also has the advantage of enhanced ON-OFF control function. The split gate structure can be used in combination with any of the planar, buried, recessed and double gate structures, and it can be applied to medium, small and large power semiconductor devices and high voltage integrated circuits as well.

It will be apparent that many modifications and variations may be effected without departing from the scope of the novel concepts of the present invention.

What is claimed is:

1. An insulated gate static induction thyristor with a split gate type shorted cathode structure, comprising an anode region, a cathode region and a control region formed in a high-resistivity layer, wherein:

said control region includes first and second gate regions split from each other;

said cathode region is formed in said high-resistivity layer between said first and second gate regions;

a channel region is formed in said high-resistivity layer which is surrounded by said first and second gate regions;

a shield gate electrode formed in contact with said first gate region and a cathode electrode formed in contact with said cathode region are electrically shorted to each other to form a shorted cathode structure;

an insulated gate control gate electrode is formed above said second gate region with an insulating layer interposed therebetween, a current flow between said cathode region and said anode region being controlled by a voltage which is applied to said insulated gate control gate electrode;

a first depletion layer is formed by the built-in potential between said first gate region and said high-resistivity layer, and a second depletion layer is formed by the built-in potential between said second gate region and said high-resistivity layer, both said first and second depletion layers are formed in said high-resistivity layer near said cathode region, said first and second depletion layer essentially contact each other enabling the potential of said second gate region to be controllable by the potential of said first gate region;

a potential barrier which is controllable by a static induction effect is formed in said channel region and the height of said potential barrier is static inductively controlled by a voltage which is applied to said insulated gate control gate electrode;

holes injected from said anode mainly flow through said first gate region and partly flow through said channel region into said cathode electrode shorted to said shield gate electrode; and electrodes injected from said cathode region mainly flow through said channel region.

2. The thyristor of claim 1 wherein an auxiliary cathode region of the same conductivity type as that of said cathode region is formed in said second gate region, and an essentially insulated gate transistor is formed between said auxiliary cathode region and said cathode region by said second gate region and said insulated gate control gate electrode formed above said second gate region but isolated therefrom by an insulating layer; and wherein electrons injected from said auxiliary cathode region are stored in said cathode region, and a potential barrier which is controlled by said static induction effect is formed in said high-resistivity layer adjoining said cathode region by said first and second depletion layers spreading from said first and second gate regions.

3. The thyristor of claim 1, wherein said insulated gate control gate electrode is extended over said high-resistivity layer surrounded by said first and second gate regions and over said first gate region, with an insulating layer interposed therebetween, thereby forming an essentially insulated gate transistor between said first and second gate regions.

4. The thyristor of claim 1, wherein said second gate region is electrically shorted to said cathode region via said cathode electrode.

5. The thyristor of claim 1, wherein said first gate region is larger than said second gate region.

6. The thyristor of claim 1, wherein said first gate region has an impurity concentration higher than that of said second gate region.

7. The thyristor of claim 1, wherein said first gate region includes a medium or low impurity concentration region of the same conductivity type as that of said first gate region and formed deeper than said second gate region and a high impurity concentration region formed in said medium or low impurity concentration region.

8. The thyristor of claim 1, wherein said first gate region is formed deeper and wider than said second gate region.

9. The thyristor of claim 1, wherein said first and second gate regions are each formed as a planar gate structure.

10. The thyristor of claim 1, wherein said first gate region has a buried gate structure.

11. The thyristor of claim 1, wherein said insulated gate control gate electrode has a recessed gate structure.

12. The thyristor of claim 1, wherein said cathode region, said anode region and said first and second gate regions are all formed near the same main wafer surface as a lateral structure.

13. The thyristor of claim 1, wherein said high-resistivity layer is formed in a dielectric substrate.

14. An insulated gate static induction thyristor comprising:

a high resistivity layer;

an anode region formed in said high resistivity layer;

a cathode region formed in said high resistivity layer and spaced frown said anode region;

first and second gate regions formed in said high resistivity layer and on substantially opposite sides of said cathode region, said first and second gate regions defining a channel region between said first and second gate regions, said first gate region forming a depletion layer in said high resistivity layer by a built-in potential between said first gate region and said high resistivity layer, said second gate region forming a depletion layer in said high resistivity layer by a built-in potential between said second gate region and said high resistivity layer, said first and second depletion layers being positioned to have a potential of said first gate region control a potential of said second gate region;

a shield gate electrode electrically contacting said first gate region;

a cathode electrode electrically contacting said cathode region and said shield gate electrode to form a shorted cathode structure;

an insulating layer positioned on said second gate region;

an insulated gate control gate electrode positioned on said insulating layer to form a potential barrier in said channel region by a static induction effect where a height of said potential barrier is static inductively controlled by a voltage applied to said gate electrode, said voltage applied to said gate electrode controlling a current flow between said anode region and said cathode region, a majority of holes injected from said anode region flowing into said first gate region and a minority of holes injected from said anode region flowing though said channel region into said cathode electrode, a majority of electrons injected from said cathode region flowing through said channel region.

* * * * *

UNITED STATES PATENT AND TRADEMARK OFFICE
CERTIFICATE OF CORRECTION

PATENT NO. : 5,461,242

DATED : October 24, 1995

INVENTOR(S) : MURAOKA et al.

It is certified that error appears in the above-identified patent and that said Letters Patent is hereby corrected as shown below:

On the title page, please correct the assignee data as follows:

[73] Assignee: Toyo Denki Seizo Kabushiki Kaisha and Takeshige Tamamushi both of Tokyo, Japan Signed and Sealed this Sixth Day of February, 1996

Attest:

BRUCE LEHMAN

*Attesting Officer*   *Commissioner of Patents and Trademarks*